(12) United States Patent
Liu et al.

(10) Patent No.: US 11,758,668 B2
(45) Date of Patent: Sep. 12, 2023

(54) ELECTRONIC DEVICE WITH A FLEXIBLE DISPLAY SCREEN

(71) Applicant: BEIJING XIAOMI MOBILE SOFTWARE CO., LTD., Beijing (CN)

(72) Inventors: Zhenhua Liu, Beijing (CN); Pengfei Li, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 66 days.

(21) Appl. No.: 17/518,406

(22) Filed: Nov. 3, 2021

(65) Prior Publication Data

US 2022/0418123 A1 Dec. 29, 2022

(30) Foreign Application Priority Data

Jun. 25, 2021 (CN) .......................... 202110713510.3

(51) Int. Cl.
H05K 5/00 (2006.01)
H05K 5/02 (2006.01)
G01D 5/14 (2006.01)

(52) U.S. Cl.
CPC ........... *H05K 5/0217* (2013.01); *G01D 5/145* (2013.01); *H05K 5/0017* (2013.01)

(58) Field of Classification Search
USPC ....... 361/807, 727, 728, 730, 752, 756, 796, 361/809, 810
See application file for complete search history.

(56) References Cited

U.S. PATENT DOCUMENTS

| 10,904,371 B1* | 1/2021 | Song | G06F 1/1656 |
| 2014/0211399 A1* | 7/2014 | O'Brien | G06F 1/1652 |
| | | | 29/592.1 |

(Continued)

FOREIGN PATENT DOCUMENTS

| CN | 112153180 A | 12/2020 |
| CN | 112866451 A | 5/2021 |

(Continued)

OTHER PUBLICATIONS

Japanese Patent Application No. 2021-182111, Office Action dated Nov. 29, 2022, 4 pages.

(Continued)

*Primary Examiner* — Hung S. Bui
(74) *Attorney, Agent, or Firm* — COZEN O'CONNOR

(57) ABSTRACT

An electronic device with a flexible display screen includes: a housing with a first housing and a second housing enclosed to form a receiving structure; a sliding rail mechanism arranged in the receiving structure, connected to the second housing, and slidably arranged to the first housing; a flexible display screen with a first end connected to the sliding rail mechanism and a second end connected to the first housing; and a support assembly including a first support plate connected to the first housing and a second support plate slidably connected to the first support plate as well as connected to the sliding rail mechanism. The sliding rail mechanism drives the first end of the flexible display screen to be switched between an expanded state and a retracted state. When expanding, the second support plate slides relative to the first support plate to support the expanded part of the flexible display screen.

20 Claims, 25 Drawing Sheets

(56) References Cited

U.S. PATENT DOCUMENTS

2018/0103550 A1\* 4/2018 Seo .................... G06F 1/1601
2020/0329572 A1\* 10/2020 Wittenberg ........... G06F 1/1652
2021/0098723 A1\* 4/2021 Shin .................... G06F 3/0488

FOREIGN PATENT DOCUMENTS

JP   2012134971 A   7/2012
KR   20180039799 A   4/2018

OTHER PUBLICATIONS

Japanese Patent Application No. 2021-182111, English translation of Office Action dated Nov. 29, 2022, 4 pages.
European Patent Application No. 21207245.8 extended Search and Opinion dated May 12, 2022, 15 pages.
Korean Patent Application No. 10-2021-0146597, Office Action dated Feb. 20, 2023, 6 pages.
Korean Patent Application No. 10-2021-0146597, English translation of Office Action dated Feb. 20, 2023, 6 pages.

\* cited by examiner

ELECTRONIC DEVICE WITH A FLEXIBLE DISPLAY SCREEN

CROSS-REFERENCE TO RELATED APPLICATION

The present disclosure is based on and claims priority to Chinese Patent Application No. 202110713510.3, filed on Jun. 25, 2021, the entire contents of which are incorporated herein by reference.

BACKGROUND

With the continuous advancement of screen technology including large-scale production of foldable flexible screens and the advent of 0.01 mm flexible display screens all over the world, the form factors for terminal products are becoming increasingly diverse. From smart wearables to smart homes and smart phone terminals, ultra-thin flexible screens lead to multi-directional designs for future products, such as foldable mobile phones, ring mobile phones, heterogeneously curved terminal products, and the like. The arrival of 5G enables all smart products to be electrically connected and the faster data transmission provided by 5G enables some modules of smart terminal products, such as camera modules, BOX acoustic modules, and the like, to be separated from smart terminal products and still achieve the same functions. With a further development of the battery technology, the size of the terminal product becomes smaller, battery capacity becomes higher, and the design form of the terminal product is more flexible.

With the increasing requirements for flexible screen products, it may be necessary to enlarge or reduce the display area when dealing with different tasks such as watching videos and making phone calls to improve the product experience. Currently, there are mainly two screen expansion structures: a foldable screen structure and a retractable screen structure.

SUMMARY

The present disclosure relates to a technical field of retractable screen products, and more particularly to an electronic device.

The present disclosure provides an electronic device to solve at least part of the problems in a related art.

According to a first aspect, embodiments of the present disclosure provide an electronic device, including:

a housing including a first housing and a second housing, the first housing and the second housing being enclosed to form a receiving structure with an opening;

a sliding rail mechanism arranged in the receiving structure and connected to the second housing, the sliding rail mechanism being slidably arranged to the first housing along a first direction;

a flexible display screen, a first end of the flexible display screen being connected to the sliding rail mechanism, a second end of the flexible display screen being connected to the first housing to cover the opening; and a support assembly including a first support plate supported below the flexible display screen and a second support plate slidably connected to the first support plate, the first support plate being connected to the first housing, the second support plate being connected to the sliding rail mechanism;

wherein the sliding rail mechanism moves along the first direction relative to the first housing to drive the second housing, the first end of the flexible display screen, and the second support plate to move relative to the first housing, such that the flexible display screen is switched between an expanded state and a retracted state; during an expanding process, the second support plate slides relative to the first support plate to support an expanded part of the flexible display screen relative to the first housing.

It is to be understood that both the foregoing general description and the following detailed description are exemplary and explanatory only and are not restrictive of the present disclosure, as claimed.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

DETAILED DESCRIPTION

Figure 1:
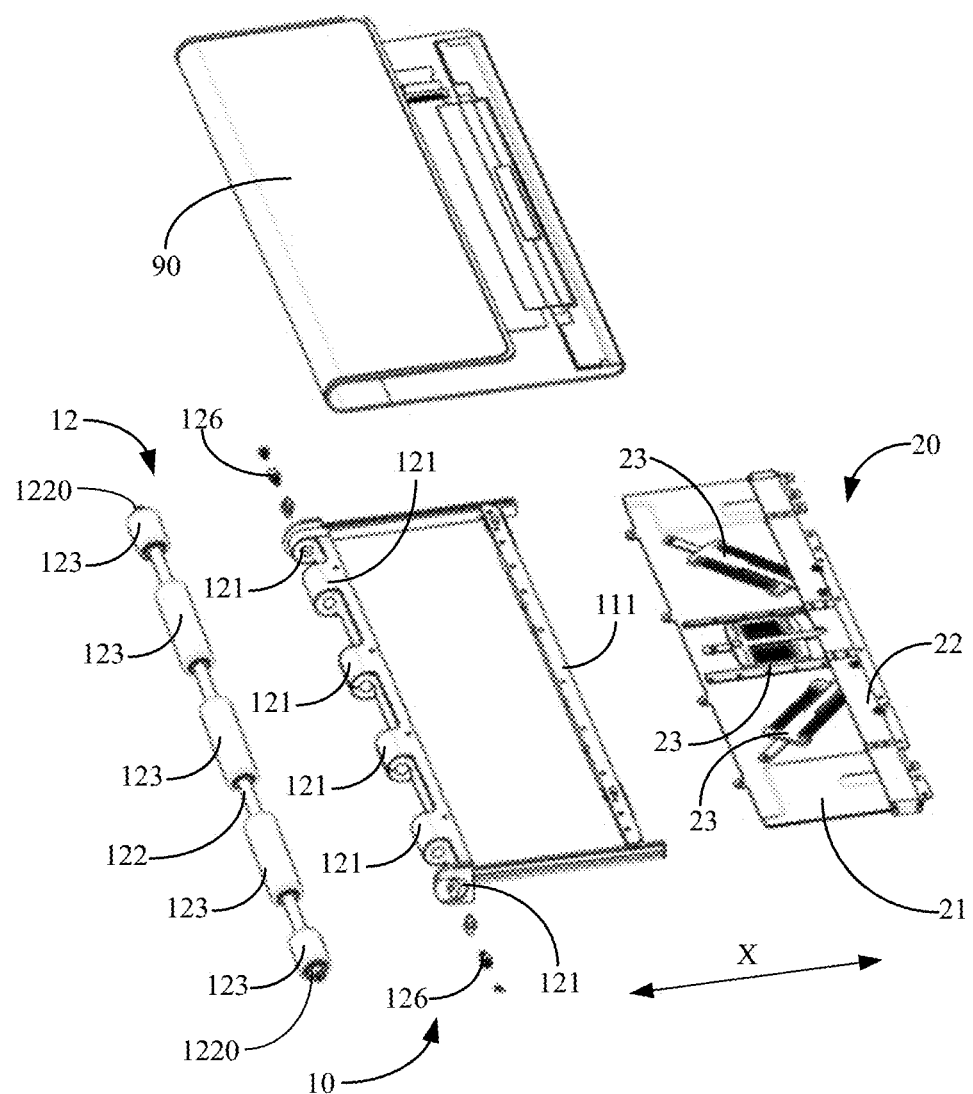
FIG. 1 is an exploded view of a retractable screen structure according to an embodiment of the present disclosure.
Figure 2:
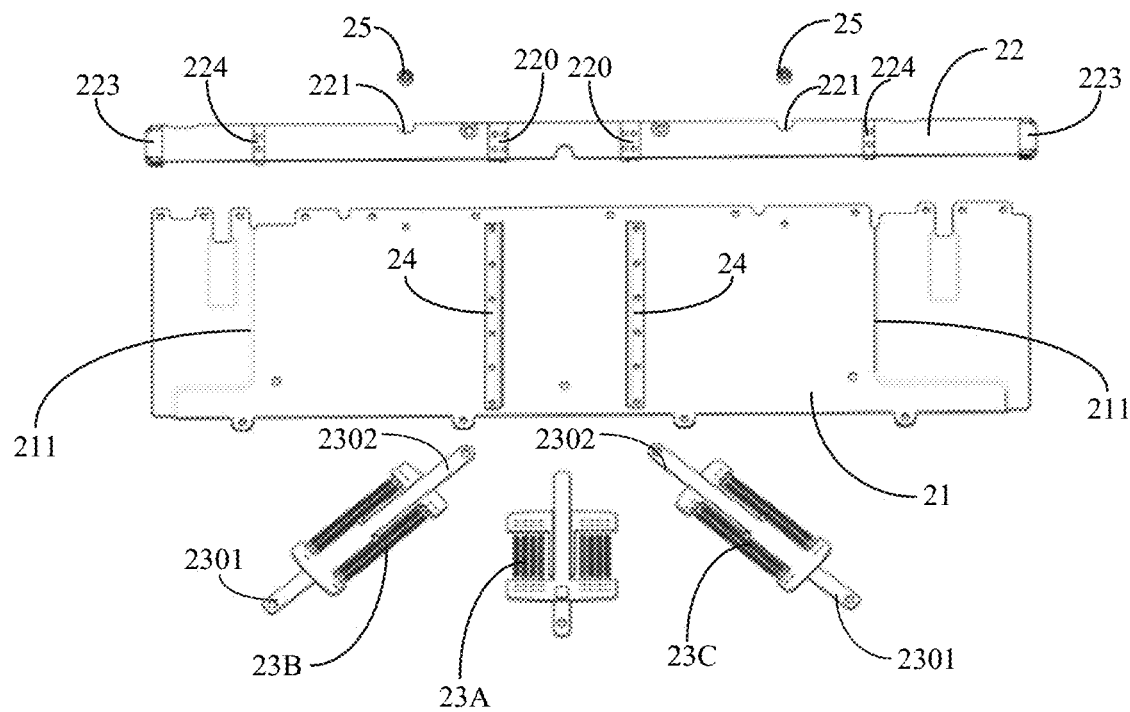
FIG. 2 is an exploded schematic view of a sliding rail assembly of a sliding rail mechanism according to an embodiment of the present disclosure.

Embodiments of the present disclosure will be described in details herein, and the examples thereof are illustrated in the accompanying drawings. When the description below concerns the drawings, same numbers in different drawings represent same or similar elements unless indicated otherwise. In the following embodiments, the embodiments illustrated do not represent all embodiments consistent with the present disclosure. Instead, they are merely examples of devices and methods consistent with some aspects of the present disclosure as detailed in the appended claims.

The terms used in the present disclosure are merely for the purpose of describing specific embodiments, which are not intended to limit the present disclosure. Unless defined otherwise, the technical or scientific terminologies used in the present disclosure shall be the general meaning understood by those skilled in the related art of the present disclosure. Terms such as "first", "second" and the like used in the descriptions and claims of the present disclosure do not indicate any order, quantity or importance, but are only used to distinguish different components. Similarly, terms such as "one" or "a" do not refer to quantity limitation, but to indicate the existence of at least one. Similarly, terms such as "one" or "a" do not refer to quantity limitation, but to indicate the existence of at least one. "a plurality" or "several" means two and more than two. Unless specified otherwise, terms such as "front portion", "rear portion", "lower portion" and/or "upper portion", and the like are merely for convenience of description, and are not limited to one position or one spatial orientation. Terms such as "comprise" or "comprising" and the like mean that the elements or objects presented before "comprise" or "comprising" contain the elements or objects presented after "comprise" or "comprising" and their equivalents, which do not exclude other elements or objects. The terms "mounted," "connected," and the like are not restricted to physical or mechanical connections, can also be electrical connections, no matter direct or indirect.

The terms used in the present disclosure are merely for the purpose of describing specific embodiments, which are not intended to limit the present disclosure. As used in the descriptions and the appended claims of the present disclosure, "a" and "the" in singular forms mean including plural forms, unless clearly indicated in the context otherwise. It should also be understood that, as used herein, the term "and/or" represents and contains any and all possible combinations of one or more associated listed items.

The present disclosure provides a driving mechanism and an electronic device. A sliding rail mechanism, and the electronic device of the present disclosure will be described in detail below with reference to the accompanying drawings. In the case of no conflict, the features in the following embodiments and implementations may be combined with each other.

Referring to FIGS. 1 to 4, an embodiment of the present disclosure provides an electronic device, which may be a mobile phone, a mobile terminal, a tablet computer, a laptop, a handheld terminal device with a screen, a vehicle-mounted display device, and the like. The electronic device includes a housing, a flexible display screen 90, a sliding rail mechanism, a rotating shaft assembly and a driving mechanism 99.

The sliding rail mechanism includes a bracket 11 and a sliding rail assembly 20. The sliding rail assembly 20 includes a fixed base 21, a sliding member 22 configured to connect the flexible display screen 90 of a retractable screen structure, and an elastic assembly 23. The fixed base 21 is fixedly connected to the bracket 11, the sliding member 22 is slidably arranged on the fixed base 21 along a first direction X (a vertical direction illustrated in FIG. 3), a first end 2301 of the elastic assembly 23 is connected to the fixed base 21, and a second end 2302 of the elastic assembly 23 is connected to the sliding member 22. When sliding relative to the fixed base 21 along the first direction X, the sliding member 22 drives the second end of the elastic assembly 23 and the flexible display screen 90 to move together. The elastic assembly 23 is stretched or compressed under the drive of the sliding member 22 to deform, thereby generating a pre-tension to the flexible display screen 90. It can be understood that the sliding member 22 slides relative to the fixed base 21 along a direction indicated by an arrow in FIG. 3, and then stretches the elastic assembly 23 to generate a reverse tension force.

Through the above arrangement, the sliding member 22 moves along the first direction X relative to the fixed base 21, and then enables to drive the flexible display screen 90 of the retractable screen structure to move together, thereby achieving the expanding and retracting of the flexible display screen 90. The sliding member 22 drives the elastic member 23 to move together so as to stretch the elastic member 23, thereby generating a pre-tension on the flexible display screen 90. Thus, the flexible display screen 90 becomes much flatter when expanded, thereby preventing visual problems such as bulging, swelling and distortion of the screen when the whole device is slid open.

In some possible implementations, the sliding rail assembly 20 further includes at least one guide rail 24 arranged on the fixed base 21 and extending along the first direction X, the sliding member 22 is defined with a sliding groove 220 corresponding to the guide rail 24, and the sliding member 22 is slidably arranged on the guide rail 24 through the sliding groove 220. In the present embodiment, four sets of guide rails 24 are provided and symmetrically arranged on the fixed base 21, such that the sliding member 22 may slide more stably. In other examples, there may also be other numbers of guide rails 24, which is not limited in the present disclosure.

Figure 3:
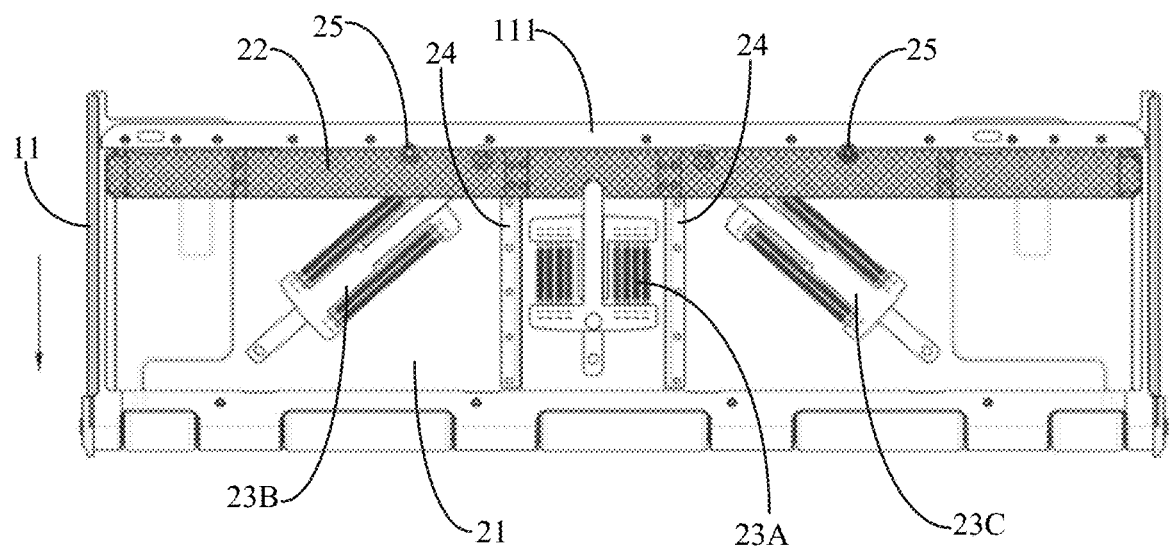
FIG. 3 is a structural view of a sliding rail mechanism according to an embodiment of the present disclosure.

In some possible implementations, the sliding rail assembly 20 further includes at least one limit stopper 25, arranged at an end of the fixed base 21 away from the bracket 11 (i.e., an upper end in FIG. 3). The sliding member 22 is provided with a limit portion 221 abutting against and cooperating with the limit stopper 25. The limit stopper 25 abuts against and cooperates with the limit portion 221 of the sliding member 22 to limit a starting position of the sliding member 22 and also prevent the sliding member 22 from separating from the guide rail 24. In the present embodiment, the limit portion 221 may be understood as a groove, two limit stoppers 25 are provided and symmetrically arranged on the fixed base 21, two limit portions 221 are provided and correspond to the limit stoppers 25, which is not limited in the present disclosure. In the example illustrated in FIG. 3, the limit stoppers 25 are arranged at an upper end of the fixed base 21, and a starting position of the sliding member 22 is located at the upper end of the fixed base 21. In this state, the elastic assembly 23 applies an elastic pre-tension to the sliding member 22 so as to keep the sliding member 22 at the starting position.

Figure 4:
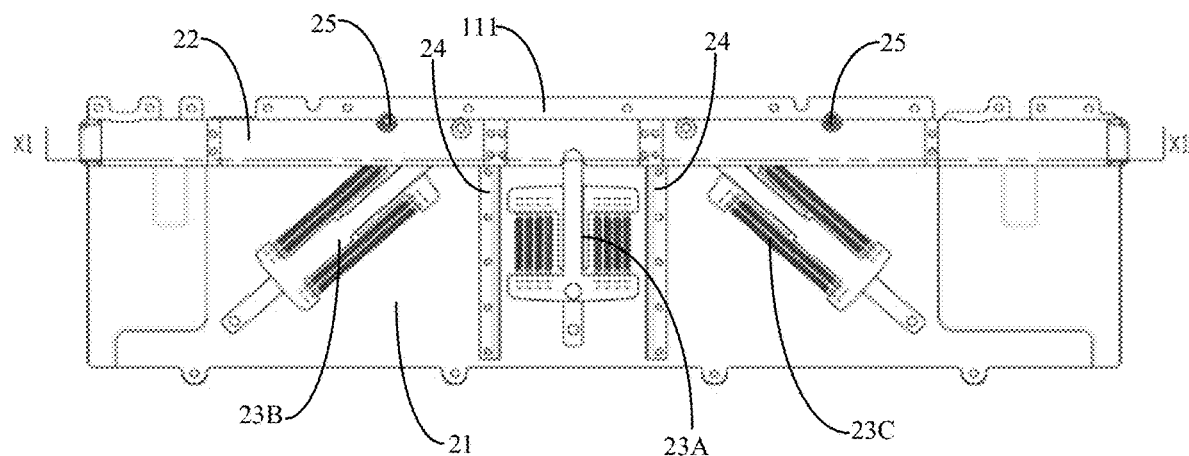
FIG. 4 is a structural view of a sliding rail assembly of a sliding rail mechanism according to an embodiment of the present disclosure.
Figure 5:
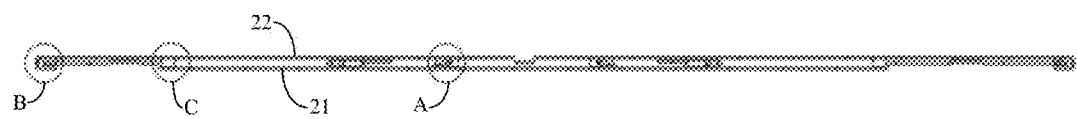
FIG. 5 is a sectional view illustrated in FIG. 4 along X1-X1 direction.
Figure 6:
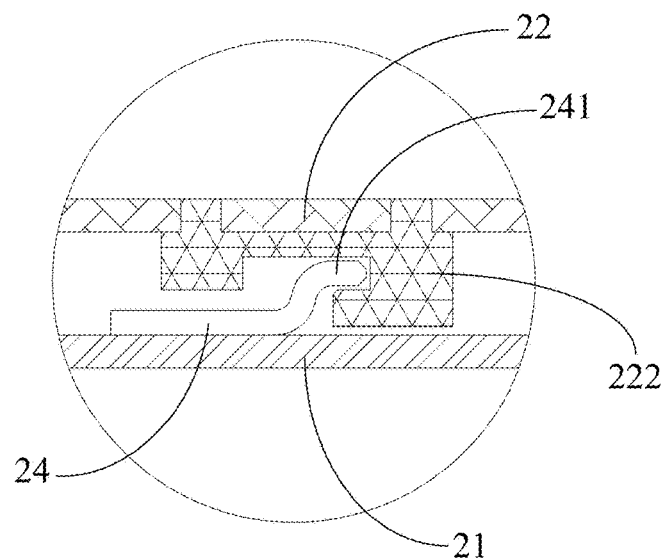
FIG. 6 is a partially enlarged view of a position A in FIG. 5.

Referring to FIGS. 4 to 6, in some possible implementations, at least one side of the guide rail 24 is provided with a clamping portion 241, and the sliding member 22 is provided with a first snap portion 222 snapped with the clamping portion 241. The sliding member 22 is snapped with the clamping portion 241 of the guide rail 24 through the first snap portion 222 so as to be more securely connected to the guide rail 24, such that the sliding member 22 may more stably slide along the guide rail 24. It may be understood that the clamping portion 241 may be an inverted hook structure machined from a sheet metal part to prevent the sliding member 22 from moving away from the guide rail 24. In the present embodiment, two sides of the guide rail 24 are each provided with the clamping portion 241, which is not limited in the present disclosure.

Figure 7:
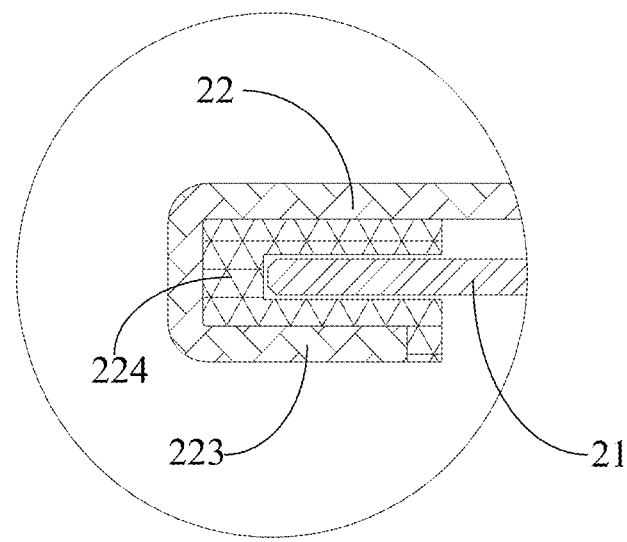
FIG. 7 is a partially enlarged view of a position B in FIG. 5.

Referring to FIG. 7, in some possible implementations, the side of the sliding member 22 is provided with a second snap portion 223 snapped with a side of the fixed base 21. The sliding member 22 is snapped with the side of the fixed base 21 through the second snap portion 223, such that the sliding member 22 and the fixed base 21 are connected more stably and the sliding member 22 is prevented from separating from the fixed base 21 when sliding, thus improving the sliding stability of the sliding member 22. Further, the sliding rail assembly 20 further includes a plastic snap 224, covering and snapped at the side of the fixed base 21, and the second snap portion 223 is snapped to the plastic snap 224. The plastic snap 224 enables to reduce friction between the second snap portion 223 and the side of the fixed base 21, reduce wear and ensure smooth sliding. In the present embodiment, the plastic snap 224 may be made of POM (Polyoxymethylene) plastic which is a self-lubricating plastic. The sliding member 22 and the plastic snap 224 may be combined as one part through an insert-molding process. A design gap between the plastic snap 224 and the side of the fixed base 21 is 0.05 to ensure that the sliding member 22 may only slide along an extending direction of the guide rail 24, i.e., the first direction X, thus improving the structural stability.

Figure 8:
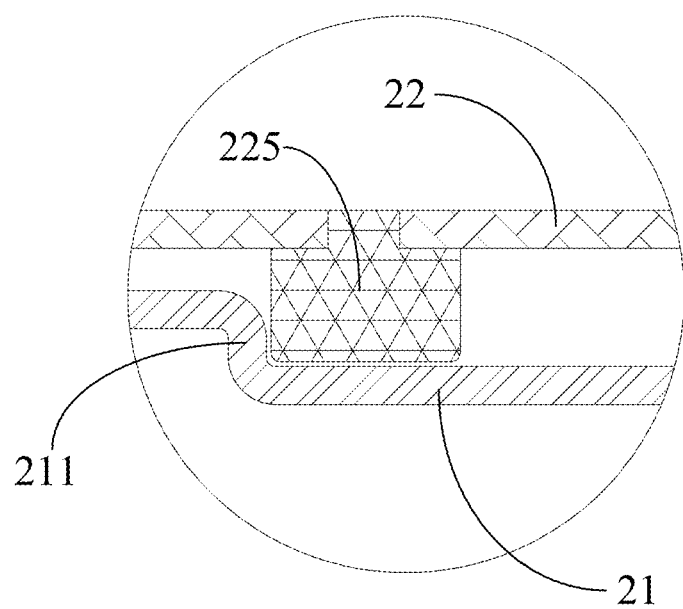
FIG. 8 is a partially enlarged view of a position C in FIG. 5.

Referring to FIG. 8, in some possible implementations, the fixed base 21 is provided with a step portion 211 extending along the first direction X, and the sliding member 22 is provided with an abutting block 225 abutting against the step portion 211. Through cooperation between the abutting block 225 and the step portion 211, the sliding member 22 may be further prevented from separating from the fixed base 21 when sliding.

Figure 9:
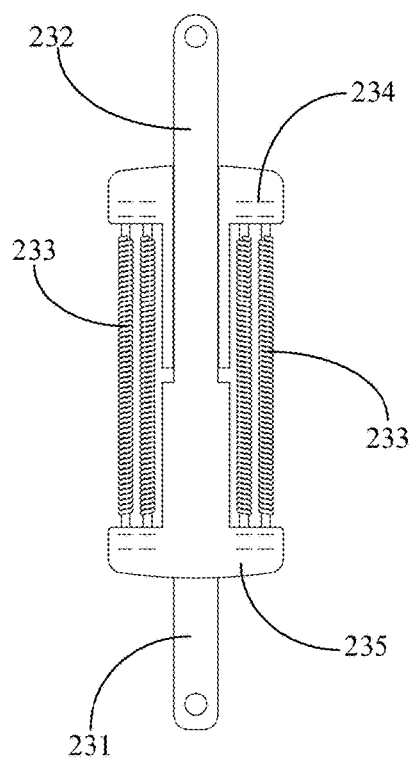
FIG. 9 is a structural view of an elastic assembly of a sliding rail mechanism according to an embodiment of the present disclosure.

Referring to FIG. 9, in some possible implementations, the elastic assembly 23 includes a first rod 231, a second rod 232, and elastic members 233. The first rod 231 and the second rod 232 are inserted into each other and slidable relative to each other, and the elastic member 233 is connected between the first rod 231 and the second rod 232. The first rod 231 is connected to the fixed base 21, and the second rod 232 is connected to the sliding member 22. The elastic member 233 may be a spring, a tension spring, or the like, and has a pre-tension during assembly to keep the sliding member 22 at the starting position. When the first rod 231 and the second rod 232 are stretched, the spring starts to work. When sliding relative to the fixed base 21, the sliding member 22 drives the second rod 232 to slide relative to the first rod 231 and cooperates with the first rod 231 to stretch or compress the elastic member 233, such that the elastic member 233 is deformed to generate an elastic force to the sliding member 22.

Further, the first rod 231 and the second rod 232 are each defined with a sliding groove, and the first rod 231 and the second rod 232 are inserted into each other and slidable relative to each other. A first end (a lower end illustrated in FIG. 9) of the first rod 231 is fixed to the fixed base 21 by a rivet, and a first end (an upper end illustrated in FIG. 9) of the second rod 232 is fixed to the sliding member 22 by a rivet, a second end of the first rod 231 protrudes outward to form a first protrusion 234, and a second end of the second rod 232 protrudes outward to form a second protrusion 235; there are a plurality sets of the elastic members 233 evenly arranged between the first protrusion 234 and the second protrusion 235, which may provide sufficient elastic force. When sliding relative to the fixed base 21, the sliding member 22 drives the second rod 232 to slide relative to the first rod 231 and cooperates with the first rod 231 to stretch the elastic member 233, such that the elastic member 233 is deformed to generate a reverse tension on the sliding member 22, thus ensuring that the flexible display screen is in a "tightened" state.

In some possible implementations, there are a plurality of the elastic assemblies 23, including a first elastic assembly 23A, a second elastic assembly 23B, and a third elastic assembly 23C. The second elastic assembly 23B and the third elastic assembly 23C are symmetrically arranged on two sides of the first elastic assembly 23A. The elastic member 233 of the first elastic assembly 23A extends along the first direction X, and the elastic members 233 of the second elastic assembly 23B and the third elastic assembly 23C are symmetrically arranged along the first direction X and inclined with respect to the first direction X.

Due to limited space, it is difficult for a single guide rail to achieve such a large elastic stroke. Based on the above arrangement, the three sets of elastic assemblies may form a relay form to improve the sliding stroke of the elastic assemblies. The second elastic assembly 23B and the third elastic assembly 23C are in the same design and are arranged symmetrically on two sides of the elastic assembly 23A. An initial compression amount of the elastic member of the first elastic assembly 23A may be slightly greater than the initial compression amounts of the elastic members of the second elastic assembly 23B and the third elastic assembly 23C, thereby achieving a greater sliding stroke. Assuming that the designed total sliding stroke is 30.00 mm, the first elastic assembly 23A may start working after the sliding member 22 slides by 19 mm.

In some possible embodiments, the sliding rail assembly 20 may be fixed to the bracket 11 as a whole by riveting. An end of the bracket 11 may include a connecting plate 111, and the fixed base 21 may be a stamped metal plate and fixed to the connecting plate 111 through a riveting process. The flexible display screen 90 is fixed to the sliding member 22 of the sliding rail assembly 20. The bracket 11 may be made of an aluminum alloy to improve the structural strength. The sliding member 22 may be machined from a SUS stainless steel plate and a POM plastic by the insert-molding process. The stainless steel plate may serve as a body to play the role of strength support. The sliding groove may be made of the POM plastic by insert-molding and may slide relative to the fixed base 21 and the guide rail 24 to reduce friction. The limit stopper 25 may be made of a plastic material and may limit the starting position of the sliding member 22 and also prevent the sliding member 22 from separating from the guide rail 24. The guide rail 24 may be machined from stainless steel by a stamping process and fixed to the fixed base 21 by spot welding. The guide rail 24 cooperates with the sliding groove 220 in the sliding member 22 to form an inverted hook structure to prevent the sliding member 22 from moving away from the guide rail 24 when sliding. An exposed surface of the sliding member 22 may serve as an adhesive area 226 to be adhered and fixed to the flexible display screen 90.

Figure 10:
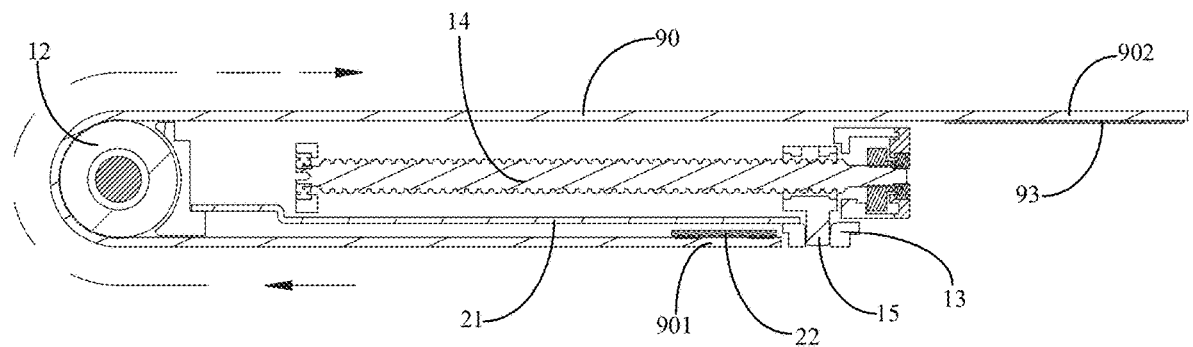
FIG. 10 is a structural view of a retractable screen structure according to an embodiment of the present disclosure.

Referring to FIGS. 1 and 10, an embodiment of the present disclosure provides a retractable screen structure, including the sliding rail mechanism and the flexible display screen 90 described in the above embodiments. The rotating shaft assembly 12 is arranged on a side of the bracket 11 away from the sliding rail assembly 20, and an axial direction of the rotating shaft assembly 12 is perpendicular to the first direction X. A first end of the flexible display screen 90 is connected to the sliding member 22, and a second end of the flexible display screen 90 is wound on the rotating shaft assembly 12.

The rotating shaft assembly 12 includes a rotating shaft support, a rotating shaft 122, and a rotating wheel. The rotating shaft support is connected to a side of the bracket 11 away from the sliding rail assembly 20 and is defined with a shaft hole, and a circumferential direction of the shaft hole is perpendicular to the first direction X. The rotating shaft 122 passes through the shaft hole, and the rotating wheel is fitted over the rotating shaft 122. The flexible display screen 90 is wound on the rotating wheel, and when the flexible display screen 90 is expanded or retracted, the rotating wheel is driven to rotate. It may be understood that the first end 901 of the flexible display screen 90 is connected to the sliding member 22 of the sliding rail assembly 20, and the second end 902 of the flexible display screen 90 is wound on the rotating wheel. In the present embodiment, the flexible display screen 90 is formed by bonding a flexible OLED screen and a layer of extremely thin stainless steel mesh together and has great flexibility.

Based on the above arrangement, the flexible display screen 90 is wound on the rotating wheel of the rotating shaft assembly 12. When the flexible display screen 90 is expanded or retracted, the rotating wheel is driven to rotate, that is, the rotating wheel rotates passively. The rotating wheel may function as a pulley such that the flexible display screen 90 may be expanded and retracted more smoothly, which effectively reduces the friction and energy loss during the expanding and retracting process of the flexible display screen 90, thereby enabling the flexible display 90 to be expanded or retracted more smoothly.

In some possible implementations, the rotating shaft 122 is fixedly connected to the shaft hole, and the rotating wheel is rotatably connected to the rotating shaft 122. It may be understood that the rotating shaft 122 is fixedly connected to the rotating shaft support, the rotating wheel is rotatable relative to the rotating shaft 122, and the rotating shaft does not rotate relative to the rotating shaft support. When the flexible display screen 90 is expanded or retracted, only the rotating wheel is driven to rotate.

Figure 11:
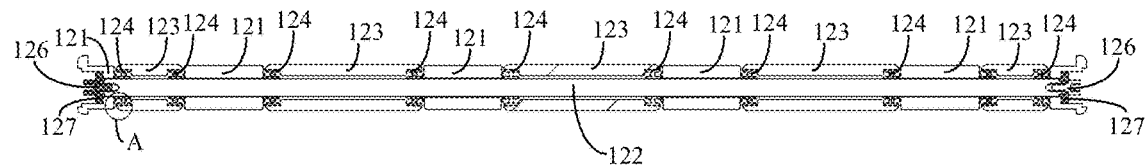
FIG. 11 is a structural view of a rotating shaft assembly of a retractable screen structure according to an embodiment of the present disclosure.

Referring to FIGS. 1 and 11, in some possible implementations, the rotating shaft support includes a plurality of sub-supports 121, which are arranged on the bracket 11 along a direction perpendicular to the first direction X and spaced apart from each other. Each sub-support 121 is defined with a sub-shaft hole, the sub-shaft holes of the plurality of sub-supports 121 are coaxially arranged to define the shaft hole, and the rotating shaft 122 passes through the plurality of sub-shaft holes so as to be fixedly connected to the plurality of sub-supports 121. The rotating shaft includes a plurality of sub-rotating wheels 123, and one of the plurality of sub-rotating wheels 123 is arranged between two adjacent sub-supports 121. It may be understood that the rotating shaft support is configured as the plurality of sub-supports 121, the rotating wheel is configured as the plurality of sub-rotating wheels 123, and the sub-supports 121 and the sub-rotating wheels 123 are arranged alternately, which may ensure the rotation performance of the rotating wheel, enhance the strength of the rotating shaft support, and improve the overall structural strength. It may be understood that each of the sub-supports 121 of the rotating shaft support is fixedly connected to the bracket 11, or may also be integrally formed with the bracket 11. It should be noted that all the sub-supports 121 may be different in size, for example, may be divided into small supports and large supports, and the sub-supports located on both sides is small supports, and the sub-support located at middle position is a large support. All the sub-rotating wheels 123 may also be different in size, for example, may be divided into large rotating wheels and small rotating wheels, which may be arranged according to actual needs and will not be limited in the present disclosure.

In some possible implementations, the rotating shaft assembly 12 further includes a plurality of first bearings 124 fitted over the rotating shaft 122, and each of two sides of the sub-rotating wheel 123 is provided with one first bearing 124. The first bearing 124 includes an inner bearing ring and an outer bearing ring rotatably connected to the inner bearing ring, the inner bearing ring is connected to the rotating shaft 122, and the outer bearing ring is connected to the sub-rotating wheel 123. It may be understood that the sub-rotating wheel 123 rotates relative to the rotating shaft 122 through the first bearing 124, and the first bearing 124 may reduce the friction loss caused by the rotation of the sub-rotating wheel 123. The inner bearing ring and the rotating shaft 122 may have a zero-match design in a radial direction to ensure that the inner bearing ring cannot rotate together with the sub-rotating wheel 123. The sub-rotating wheel 123 and the rotating shaft 122 may have an avoidance design in the radial direction to ensure that a gap is defined between the sub-rotating wheel 123 and the rotating shaft 122 to achieve rotation.

Figure 12:
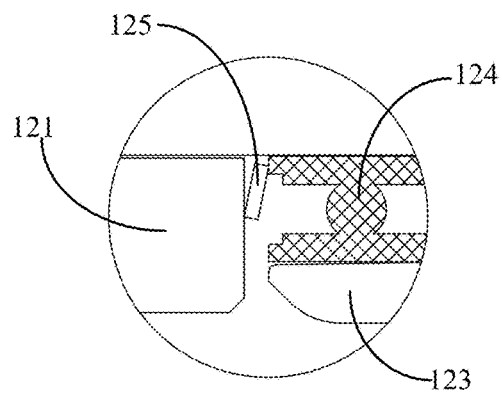
FIG. 12 is an enlarged view of position A in FIG. 11.

Referring to FIG. 12, in order to prevent the inner bearing ring from rotating together with the sub-rotating wheel 123, that is, to ensure that the inner bearing ring does not rotate relative to the rotating shaft 122, the rotating shaft assembly 12 further includes a plurality of bearing spacers 125 fitted over the rotating shaft 122, and a side of each first bearing 124 is provided with a bearing spacer 125. One end of the bearing spacer 125 abuts against the inner bearing ring, and the other end of the bearing spacer 125 abuts against the adjacent sub-support 121. In this way, the inner bearing ring and the adjacent sub-support 121 may be pressed against each other to prevent the inner bearing ring from rotating together with the sub-rotating wheel 123, thus ensuring that the inner bearing ring does not rotate relative to the rotating shaft 122. In this way, the rotation of the sub-rotating wheel 123 completely relies on the rotation of the outer bearing ring and the friction loss is relatively low.

In some possible implementations, in some possible implementations, the bearing spacer 125 is made of copper or stainless steel, with a bowl-like cross section, and has a mechanical property that is slightly compressible in a thickness direction. A bottom end of the bowl-like structure abuts against the inner bearing ring, and a bowl opening end of the bowl-like structure abuts against the adjacent sub-support 121, such that the inner bearing ring and the adjacent sub-support 121 are pressed against each other.

In some possible implementations, the rotating shaft assembly 12 further includes two sets of first fasteners 126. One end of the rotating shaft 122 is fixedly connected to the rotating shaft support through one set of the first fasteners 126, and the other end of the rotating shaft 122 is fixedly connected to the rotating shaft support through the other set of the first fasteners 126. It may be understood that the first fasteners 126 pass through the outermost sub-support 121 and are fixedly connected to the ends of the rotating shaft 122, so as to fix the rotating shaft 122 and the rotating shaft support together. In some possible implementations, a gasket 127 is further provided between the first fastener 126 and the rotating shaft support. The first fastener 126 may be a dual screw, and the gasket 127 is provided between the first fastener 126 and the outermost sub-support 121 such that the rotating shaft 122 and the rotating shaft support may be connected more firmly. Further, a gap between the sub-support 121 and the inner bearing ring may be set to zero match or slight interference (depending on the material and the sizes of the parts). Thus, a pressure exists between the bearing spacer 125 and the inner bearing ring through the locking force of the dual screws arranged at the two ends, and this pressure may ensure that the inner bearing ring does not rotate relative to the rotating shaft 122.

In the present embodiment, the sub-rotating wheel 123 may be made of the engineering plastic POM by insert-molding and is defined with a through hole in the middle and grooves at two ends to place the first bearings 124, the sub-rotating wheel 123 is fitted over the rotating shaft 122, and may be rotated passively on the rotating shaft 122 by the first bearings 124 after assembly. The rotating shaft 122 may be a D-shaped shaft with a D-shaped cross section, and is mainly configured to fix the inner bearing ring, thereby preventing the inner bearing ring from rotating relative to the rotating shaft. The rotating shaft 122 may be made of stainless steel, and the rotating shaft 122 passes through the plurality of sub-supports 121. Threads 1220 may be formed at two ends of the rotating shaft 122 to achieve fastening connection with the first fasteners 126 and to be easily fixed to a middle frame of the electronic device, thereby fixing the rotating shaft. The first fastener 126 may be made of metal material, such as a dual screw. The first fastener 126 passes through the gasket 127 and is locked on the rotating shaft 122 to lock the rotating shaft 122 and the rotating shaft support. The material of the first bearing 124 may be stainless steel or ceramic, and the first bearing 124 is mounted on the sub-rotating wheel 123. Two ends of each sub-rotating wheel 123 are each mounted with one first bearing 124 and also mounted with the bearing spacer 125. The bearing spacer 125 may be made of a metal. During mounting of the sub-rotating wheels on the rotating shaft, each of two sides of each rotating wheel is placed with one bearing spacer, and the rotating shaft passes through the inner holes of the bearing spacers. After the two ends of the rotating shaft are locked by the dual screws, the gasket functions to fix the inner bearing ring to prevent the inner bearing ring from rotating with the outer bearing ring, and the gasket further functions to ground the first bearing and the bracket.

Figure 13:
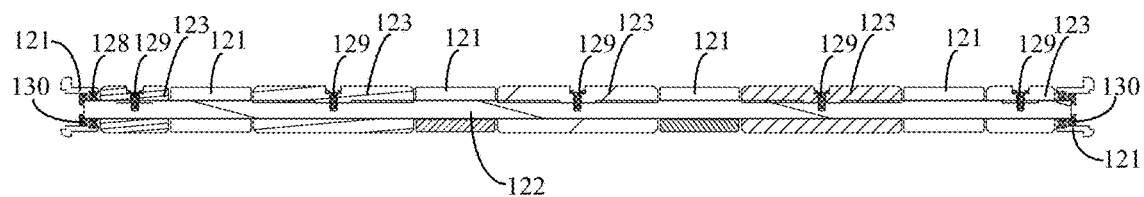
FIG. 13 is a structural view of a rotating shaft assembly of a retractable screen structure according to another embodiment of the present disclosure.

Referring to FIGS. 1 and 13, in some possible implementations, the rotating shaft 122 is rotatably connected to the shaft hole, and the rotating wheel is fixedly connected to the rotating shaft 122. It may be understood that the rotating shaft 122 is fixedly connected to the rotating wheel, the rotating wheel does not rotate relative to the rotating shaft 122, and the rotating shaft 122 is rotatable relative to the rotating shaft support. When the flexible display screen 90 is expanded or retracted, the flexible display screen 90 drives the rotating wheel and the rotating shaft 122 to rotate together.

In some possible implementations, the rotating shaft support includes a plurality of sub-supports 121, which are arranged on the bracket 11 along a direction perpendicular to the first direction X and spaced apart from each other. Each sub-support 121 is defined with a sub-shaft hole; the sub-shaft holes of the plurality of sub-supports 121 are coaxially arranged to define the shaft hole, and the rotating shaft 122 passes through the plurality of sub-shaft holes so as to be fixedly connected to the plurality of sub-supports 121. The rotating shaft includes a plurality of sub-rotating wheels 123, and one of the plurality of sub-rotating wheels 123 is arranged between two adjacent sub-supports 121. It may be understood that the rotating shaft support is configured as the plurality of sub-supports 121, the rotating wheel is configured as the plurality of sub-rotating wheels 123, and the sub-supports 121 and the sub-rotating wheels 123 are arranged alternately, which may ensure the rotation performance of the rotating wheel, enhance the strength of the rotating shaft support, and improve the overall structural strength. It may be understood that each of the sub-supports 121 of the rotating shaft support is fixedly connected to the bracket 11, or may also be integrally formed with the bracket 11. It should be noted that all the sub-supports 121 may be different in size, for example, may be divided into small supports and large supports, and the sub-supports located on both sides is small supports, and the sub-support located at middle position is a large support. All the sub-rotating wheels 123 may also be different in size, for example, may be divided into large rotating wheels and small rotating wheels, which may be arranged according to actual needs and will not be limited in the present disclosure.

In some possible implementations, the rotating shaft assembly 12 further includes two second bearings 128 which are respectively fitted over two ends of the rotating shaft 122, and the ends of the rotating shaft 122 are rotatably connected to the rotating shaft support through the second bearings 128. The second bearing 128 includes an inner bearing ring and an outer bearing ring rotatably connected to the inner bearing ring, the inner bearing ring is connected to the rotating shaft support, and the outer bearing ring is connected to the rotating shaft 122. It may be understood that the rotating shaft 122 rotates relative to the sub-support 121 of the rotating shaft support through the second bearing 128, and the second bearing 128 may reduce the friction loss caused by the rotation of the rotating shaft 122. The sub-rotating wheel 123 and the rotating shaft 122 may have a zero-match design in the radial direction to ensure that the sub-rotating wheel 123 rotates with the rotating shaft 122. The sub-support 121 of the rotating shaft support and the rotating shaft 122 may have an avoidance design in the radial direction to ensure that a gap is defined between the sub-rotating wheel 123 and the rotating shaft 122 to achieve rotation. In the present embodiment, only two second bearings 128 are required to achieve the rotation of the rotating shaft 122 relative to the rotating shaft support, which reduces the number of bearings and simplifies the model design.

In some possible implementations, the rotating shaft assembly 12 further includes two shaft covers 130. One of the shaft covers 130 abuts against an inner ring of the adjacent rotating shaft 122 from one end of the shaft hole, and the other shaft cover 130 abuts against the inner ring of the adjacent rotating shaft 122 from the other end of the shaft hole. The inner bearing ring is pressed by the shaft covers 130 to limit the rotating shaft 122 in the axial direction, thereby preventing the rotating shaft 122 from being displaced in the axial direction.

In some possible embodiments, the rotating shaft assembly 12 further includes a plurality of second fasteners 129, and the second fasteners 129 pass through the sub-rotating wheels 123 and are fixedly connected to the rotating shaft 122. It may be understood that one sub-rotating wheel 123 may be fixedly connected to the rotating shaft 122 through one second fastener 129, or may also be fixedly connected to the rotating shaft 122 through the plurality of second fasteners 129, which is not limited in the present disclosure.

Referring to FIGS. 17 to 20, an embodiment of the present disclosure provides an electronic device, which may be a mobile phone, a mobile terminal, a tablet computer, a laptop, a handheld terminal device with a screen, a vehicle-mounted display device, and the like. The electronic device includes a housing, a retractable screen structure as described in the above embodiments, and a driving mechanism 99.

The housing includes a first housing 91 and a second housing 92 slidably arranged on the first housing 91 along the first direction X, the first housing 91 and the second housing 92 are enclosed to form a receiving structure 991 with an opening. The retractable screen structure is arranged in the receiving structure 991, the rotating shaft assembly 12 is located on a side close to the second housing 92, a first end 901 of the flexible display screen 90 is located on a side close to bottom of the housing, and a second end 902 of the flexible display screen 90 is connected to the first housing 91 to cover the opening. The driving mechanism 99 is arranged in the receiving structure 991. The driving mechanism 99 is connected to the sliding rail mechanism and configured to drive the sliding rail mechanism to move along the first direction X. In some possible implementations, the first housing 91 may be provided with a support plate 93, the second end of the flexible display screen 90 is connected to the support plate 93, and the support plate 93 may support and protect the flexible display screen 90.

The driving mechanism 99 includes a frame body 30, a driving assembly and a transmission assembly mounted on the frame body 30. The frame body 30 may be provided with a mounting member 302 configured to be connected to the middle frame of the electronic device, and the mounting member 302 is fixed to the middle frame by a fastener, such that the driving mechanism 99 is mounted on the middle frame. In some possible implementations, the number of driving mechanisms 99 may be set according to actual needs. In an example illustrated in FIG. 20, two driving mechanisms 99 are provided and symmetrically arranged on the first housing 91, thereby enabling to drive the sliding rail mechanism to move more stably, such that two sides of the sliding rail mechanism are subjected to uniform forces and the movement is more stably.

The driving assembly includes a driving member 31 and a reduction gearbox structure 32 connected to the driving member 31, and both the driving member 31 and the reduction gearbox structure 32 are mounted on the frame body 30. In some possible implementations, the driving member 31 may be a driving motor or driving electric-machine.

The transmission assembly includes a first transmission member 14 and a second transmission member 15 movably connected to the first transmission member 14. The first transmission member 14 is mounted on the frame body 30 and connected to the reduction gearbox structure 32. The second transmission member 15 is configured to be in transmission connection with the flexible display screen of the retractable screen structure.

The driving member 31 outputs a first torque to the reduction gearbox structure 32, and the reduction gearbox structure 32 converts the first torque into a second torque and outputs the second torque to the first transmission member 14 to drive the first transmission member 14 to rotate, and the second transmission member 15 moves relative to the first transmission member 14 to drive the flexible display screen to move. The first torque is less than the second torque. It may be understood that the driving mechanism drives the sliding rail mechanism to move along the first direction X, so as to drive the second housing 92, the sliding rail assembly 20, the first end of the flexible display screen, and the sliding member 22 to move along the first direction X relative to the first housing 91, such that the flexible display screen 90 is switched between the expanded state and the retracted state.

Based on the above arrangement, the driving mechanism 99 converts the first torque output by the driving member 99 into a higher second torque through the reduction gearbox structure, and then transmits the second torque to the first transmission member such that the first transmission member is then rotated, thereby driving the flexible display screen to move. In this way, a low torque of the driving member may be converted into a high torque to drive the first transmission member to rotate, so as to better drive the flexible display screen to move.

In some possible implementations, the driving assembly may further include a control circuit board 312 connected to the driving member 31, which is configured to control the driving member 31 according to an instruction. The control circuit board 312 may be a FPC (Flexible Printed Circuit) board. The control circuit board 312 gets breakover with a terminal main board of the electronic device. When the flexible display screen needs to be expanded, the terminal main board transmits a command "expand" to the control circuit board 312. The control circuit board 312 controls the driving electric-machine to rotate, and the driving electric-machine amplifies the torque of the driving electric-machine through the reduction gearbox structure 32 and drives the second transmission member 15 to move linearly relative to the first transmission member 14. The second transmission member 15 drives the flexible display screen to expand outward, thus completing the expanding action of the flexible display screen. When the flexible display screen needs to retract, a user may click on the display screen of the electronic device to send a command "retract" to the terminal main board. The terminal main board transmits the command "retract" to the control circuit board 312, and the control circuit board 312 then controls the driving electric-machine to rotate (in a direction opposite to the direction of expanding rotation). The driving electric-machine amplifies the torque of the driving electric-machine through the reduction gearbox structure 32 and drives the second transmission member 15 to move linearly relative to the first transmission member 14. The second transmission member 15 drives the flexible display screen to retract to the starting position. In the present embodiment, the control circuit board 312 is connected to the driving electric-machine by welding, and the control circuit board 312 gets breakover with the terminal main board, or gets breakover with the main board terminal through a BTB connector to power on the driving electric-machine, and the driving electric-machine is controlled to rotate by a control signal.

In some possible implementations, the driving electric-machine may be a DC stepper electric-machine which is an open-loop control electric-machine that converts an electric pulse signal into an angular displacement or a linear displacement. In the case of non-overload, the speed and stop position of the electric-machine only depend on frequency and pulse number of a pulse signal, and are not affected by load changes. When receiving one pulse signal, the stepper driver drives the stepper electric-machine to rotate by a fixed angle in a preset direction, and the rotation of the stepper electric-machine runs step by step at a fixed angle. The angular displacement may be controlled by controlling the pulse number, so as to achieve the purpose of accurate positioning. Moreover, the rotational speed and the rotational acceleration of the electric-machine may be controlled by controlling the pulse frequency, so as to regulate the speed and input the rotational torque.

The first transmission member 14 is a lead screw, the second transmission member 15 is a nut in threaded fit with the lead screw, and two ends of the lead screw are connected to the frame body 30 through bearings 141. The bracket 11 of the retractable screen structure is provided with a transmission member 13. The lead screw extends along the first direction X, and the nut abuts against the transmission member 13. The driving electric-machine drives the lead screw to rotate, and then drives the nut and the transmission member to move along the first direction X, thereby driving the sliding rail mechanism to move along the first direction X. It should be noted that the first transmission member and the second transmission member may also adopt structures such as gear racks, worm gears, and the like, which is not limited in the present disclosure.

In some possible implementations, the driving mechanism 99 further includes a guide rod 33 arranged on the frame body 30, and the guide rod 33 is arranged in parallel with the lead screw. The nut includes a first sleeve portion 151 and a second sleeve portion 152, the first sleeve portion 151 is in threaded connection with the lead screw, and the second sleeve portion 152 is fitted over the guide rod 33. The second transmission member 15 is further provided with a protrusion 153 for abutting against the transmission member 13 of the bracket 11 of the retractable screen structure. It may be understood that the nut is in threaded connection with the lead screw through the first sleeve portion 151, and when the lead screw rotates, the nut linearly moves relative to the lead screw. During the movement, the second sleeve portion 152 moves along the guide rod 33 to guide the nut.

In some possible implementations, the driving member 31 includes an output shaft 311, and the reduction gearbox structure 32 includes a first reduction gearbox and a second reduction gearbox. The first reduction gearbox includes a first gear 321, the second reduction gearbox includes a second gear 322 and a third gear 323 (which may be understood as a lead screw gear) engaged with the second gear 322, the third gear 323 is connected to the first transmission member 14, the second gear 322 is engaged with the first gear 321, and the first gear 321 is connected to the output shaft 311. The output shaft 311 outputs a first torque to the first gear 321, and the first torque is converted into a second torque, by the second gear 322 and the third gear 323, to be output to the first transmission member 14. Through the gear engagement of the first gear 321, the second gear 322, and the third gear 323, a low torque output by the driving electric-machine may be converted into a high torque.

In some possible implementations, the reduction gearbox structure 32 further includes a reduction gearbox end cover 34 fixedly connected to a side of the frame body 30. In some possible implementations, a side of the frame body 30 is provided with a side frame 301 configured to be fixedly connected to the reduction gearbox end cover 34, and the reduction gearbox end cover 34 is fixed to the side frame 301. The gearbox end cover 34 is fixed to the side frame 301 by a plurality of fasteners 342 (e.g., screws). The first gear 321 and the second gear 322 are both connected to the reduction gearbox end cover 34, the third gear 323 is connected to the reduction gearbox end cover 34 through the first transmission member 14, and the reduction gearbox end cover 34 functions to fix the first gear 321, the second gear 322, the third gear 323 and the first transmission member 14.

In some possible implementations, the first reduction gearbox includes a first bushing 324 fixed to the reduction gearbox end cover 34, and the first gear 321 is mounted to the first bushing 324. In some possible implementations, the reduction gearbox end cover 34 is defined with a first through hole 341, the first bushing 324 is fixed to the first through hole 341, and the first gear 321 is a sun gear and is mounted to the first bushing 324. The second reduction gearbox includes a limit post 35 fixed to the reduction gearbox end cover 34, the second gear 322 is mounted to the limit post 35, and the limit post 35 functions to limit and fix the second gear 322.

In some possible implementations, the first transmission member 14 is a lead screw, an end of the lead screw is connected to the reduction gearbox end cover 34 through the bearing 141, and the third gear 323 is engaged with the lead screw. In some possible implementations, the reduction gearbox end cover 34 is further defined with a second through hole 343, the bearing 141 is mounted inside the second through hole 343, and an end of the lead screw is mounted to the bearing 141 so as to be fixed on the frame body 30.

In some possible implementations, the first reduction gearbox further includes: a fixed gear ring 36, a driving gear 37, a planetary gear carrier 38 and a planetary gear 39.

The fixed gear ring 36 is connected to the driving member 31, and the output shaft 311 extends into the fixed gear ring 36.

The driving gear 37 is mounted in the fixed gear ring 36 and fixed to the output shaft 311. In some possible implementations, the first reduction gearbox further includes a second bushing 371, and the driving gear 37 is mounted to the second bushing 371 to protect and limit the driving gear 37.

The planetary gear carrier 38 is mounted in the fixed gear ring 36 and is engaged with and fixed to the first gear 321. In some possible implementations, the first reduction gearbox further includes a third bushing 381, and the planetary gear carrier 38 is mounted to the third bushing 381 to protect and limit the planetary gear carrier 38.

The planetary gear 39 is mounted on the planetary gear carrier 38 and is engaged with the driving gear 37.

The output shaft 311 outputs a first torque to the driving gear 37, and the first torque is reduced by the driving gear 37, the planetary gear 39, and the planetary gear carrier 38 and then transmitted to the first gear 321, achieving a first-level reduction effect. Then, the torque is reduced by the first gear 321 and then transmitted to the second gear 322, achieving a second-level reduction effect. Then, the torque is further reduced by the second gear 322 and then converted to the second torque and the second torque is transmitted to the third gear 323, achieving a third-level reduction effect. The third gear 323 transmits the second torque to the first transmission member 14 to drive the first transmission member 14 to rotate.

Based on the above arrangement, a first-level reduction gearbox is formed by the gear engagement of the driving gear 37, the planetary gear carrier 38 and the planetary gear 3. Through the gear engagement of the first gear 321, the second gear 322 and the third gear 323, second and third-level reduction gearboxes are formed. The planetary gear 39 may function as a first-level reduction gear, the first gear 321 may function as a second reduction gear, the second gear 322 may function as a third reduction gear, and the third gear 323 may function as a lead screw gear.

It may be understood that the first reduction gearbox is a core component of the driving mechanism. One end of the first reduction gearbox is mounted and welded to the driving electric-machine, and the other end of the first reduction gearbox is fixed to the frame body 30 by welding. The first reduction gearbox includes an output shaft 311 of the driving electric-machine, the driving gear 37, the second bushing 371, the planetary gear 39, the planetary gear carrier 38, the third bushing 381, the fixed gear ring 36, and the first gear 321. All parts are fixed by gear engagement, and the output shaft 311, the driving gear 37, the second bushing 371, the planetary gear 39, the planetary gear carrier 38, the third bushing 381 and the first gear 321 are all fixedly fitted inside the fixed gear ring. The driving gear 37 is fixed to the output shaft 311 of the driving electric-machine, the planetary gear carrier 38 and the first gear 321 are engaged and fixed to each other, and the other end of the first gear 321 is fixed to the first bushing 324, and is fixed to the reduction gearbox end cover 34 through the first bushing 324. The second gear 322 is fixed to the frame body 30 and the reduction gearbox end cover 34 through the limit post 35. The third gear 323 is fixed to the first transmission member 14, one end of the first transmission member 14 is fixed to the frame body 30 through a bearing 141, and the other end of the first transmission member 14 is also fixed to the reduction gearbox end cover 34 through a bearing 141. The reduction gearbox end cover 34 is fixed to the frame body 30 by a fastener 342, and the three gears (the first gear 321, the second gear 322 and the third gear 323) form second and third-level reduction gearboxes by gear engagement. The torque output by the driving electric-machine is reduced through the first reduction gearbox and the second reduction gearbox, and then a torque that is several or several tens of times greater than the output torque is output to the lead screw to drive the lead screw to rotate. The lead screw drives the nut to move. The reduction gearbox structure mainly functions to convert the low torque output by the driving electric-machine into a high torque.

In some alternative implementations, the frame body 30 may be manufactured by MIM (Powder Metallurgy), and apertures and some dimensions need to be processed by a lathe or a CNC machining center. The frame body 30 mainly functions to fix the reduction gearbox structure, the lead screws, the nuts, the bearings, the guide rod and other components. Therefore, the precision requirement and the flatness requirement for the frame body 30 are relatively high. The precision of the frame body 30 directly affects the stability of the entire driving mechanism. The entire frame body 30 may be fixed to the first housing 91 of the middle frame of the electronic device.

The nut may be made by MIM (Powder Metallurgy) and plastic two-color insert-molding, and the plastic herein is engineering plastic (POM material is commonly used), which has a self-lubricating effect. One end of the nut is fixed to the guide rod, and the other end of the nut is fixed to the lead screw. The end fixed to the lead screw needs to design a lead screw guide groove, so as to drive the nut to move linearly. According to the structural requirements of the push-out assembly, a bone position is designed on the nut to be connected and fixed to a side sliding member to push the sliding member to move. The guide rod may be made of stainless steel, which requires relatively high surface roughness, and the guide rod functions to guide and fix the nut. The lead screw is generally made of high-strength tool steel and is machined many times through a lathe or a machining center. Bearings are fixed at two ends of the lead screw, one end of the lead screw is fixed to the frame body, and the other end of the lead screw is fixed to the reduction gearbox end cover. The driving electric-machine drives the lead screw to rotate through the reduction gearbox structure, and the lead screw drives the nut to move linearly. Therefore, the strength and precision of the lead screw directly affect the stability and smoothness of the sliding member pushed by the nut.

Figure 14:
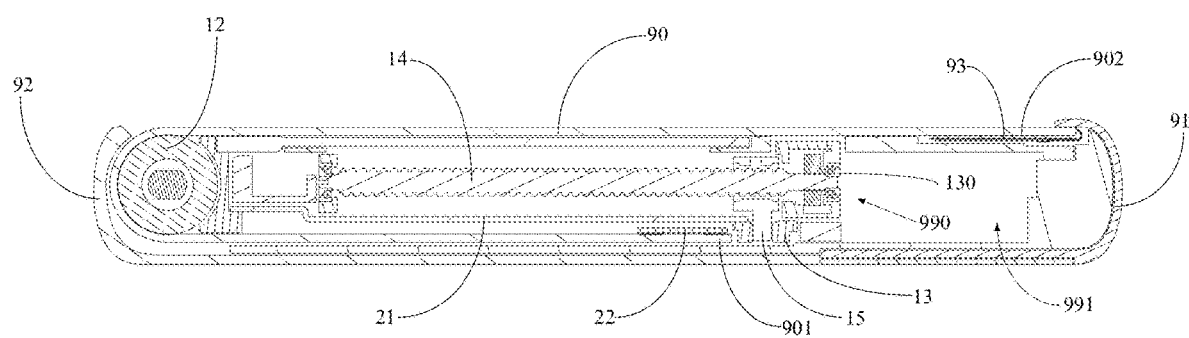
FIGS. 14 and 15 are schematic views of an electronic device according to an embodiment of the present disclosure when a flexible display screen is in a retracted state and an expanded state, respectively.

Referring again to FIGS. 14 to 16, due to the pre-tension of the elastic member of the elastic assembly, the sliding member 22 is pre-tensioned by the elastic assembly at the starting position, and due to the existence of the limit stopper 25, the sliding member 22 is kept in a static state at the starting position and the flexible display screen 90 is in a retracted state.

Figure 15:
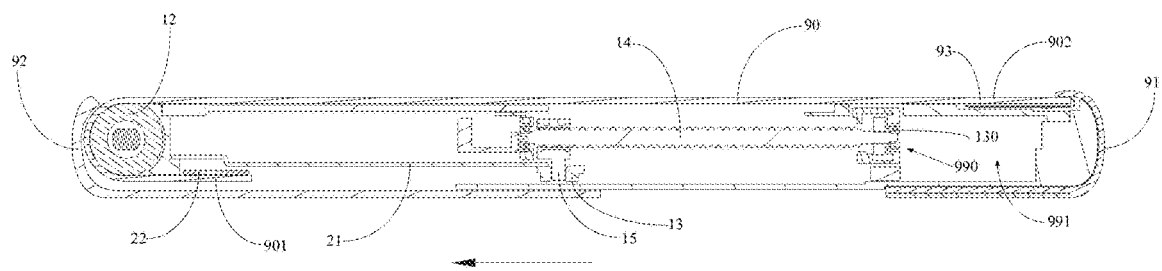
Figure 16:
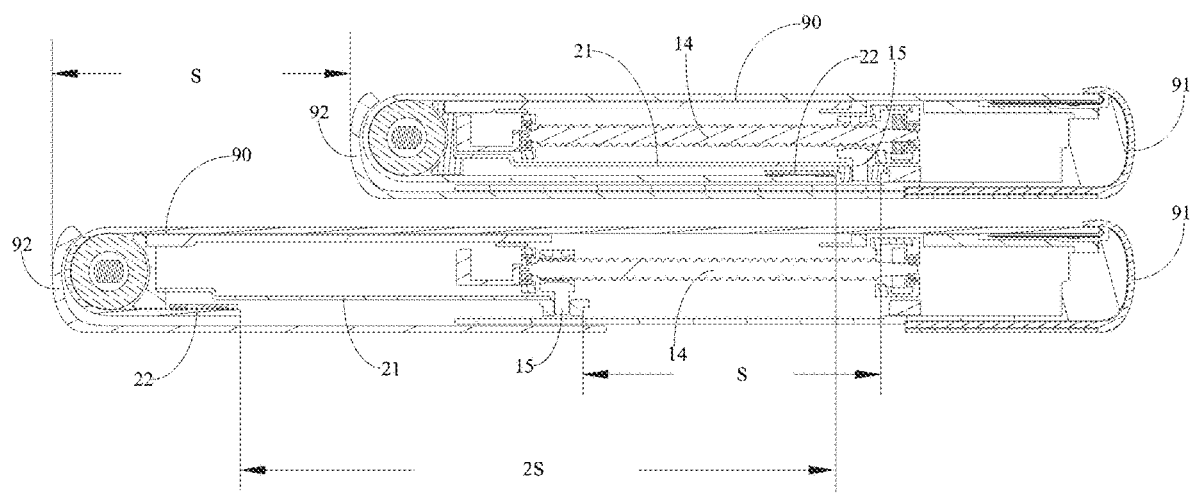
FIG. 16 shows contrast views of an electronic device according to an embodiment of the present disclosure when a flexible display screen is in a retracted state and an expanded state, respectively.
Figure 17:
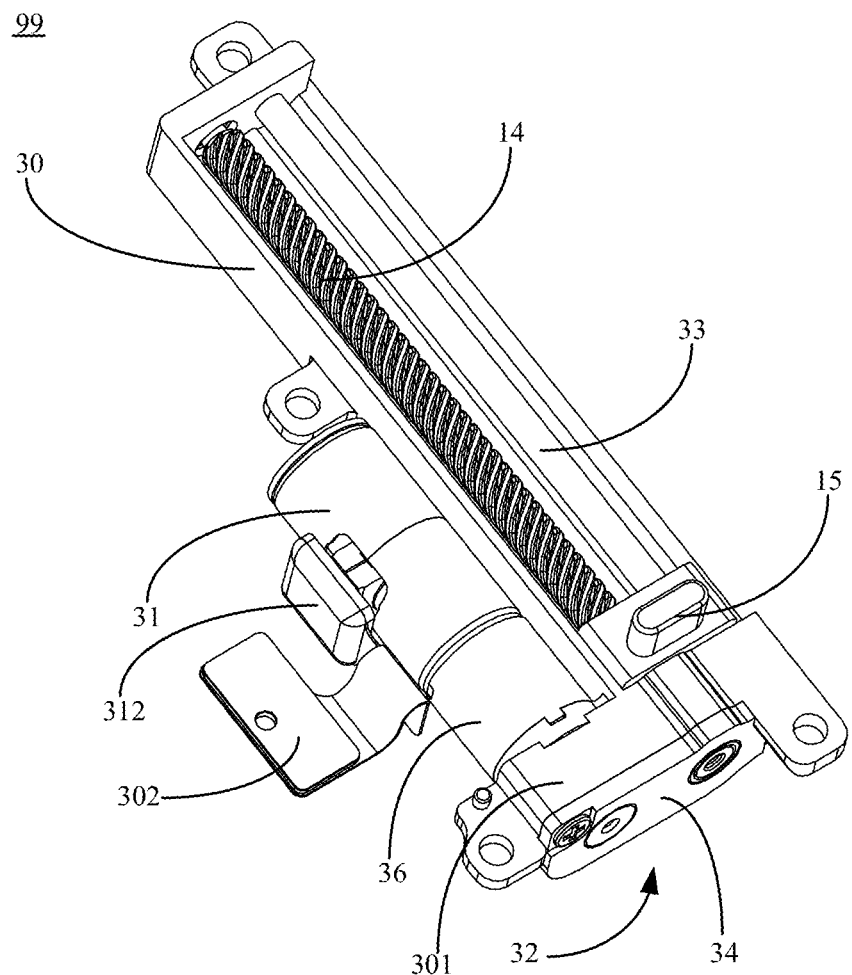
FIG. 17 is a perspective view of a driving mechanism of an electronic device according to an embodiment of the present disclosure.
Figure 18:
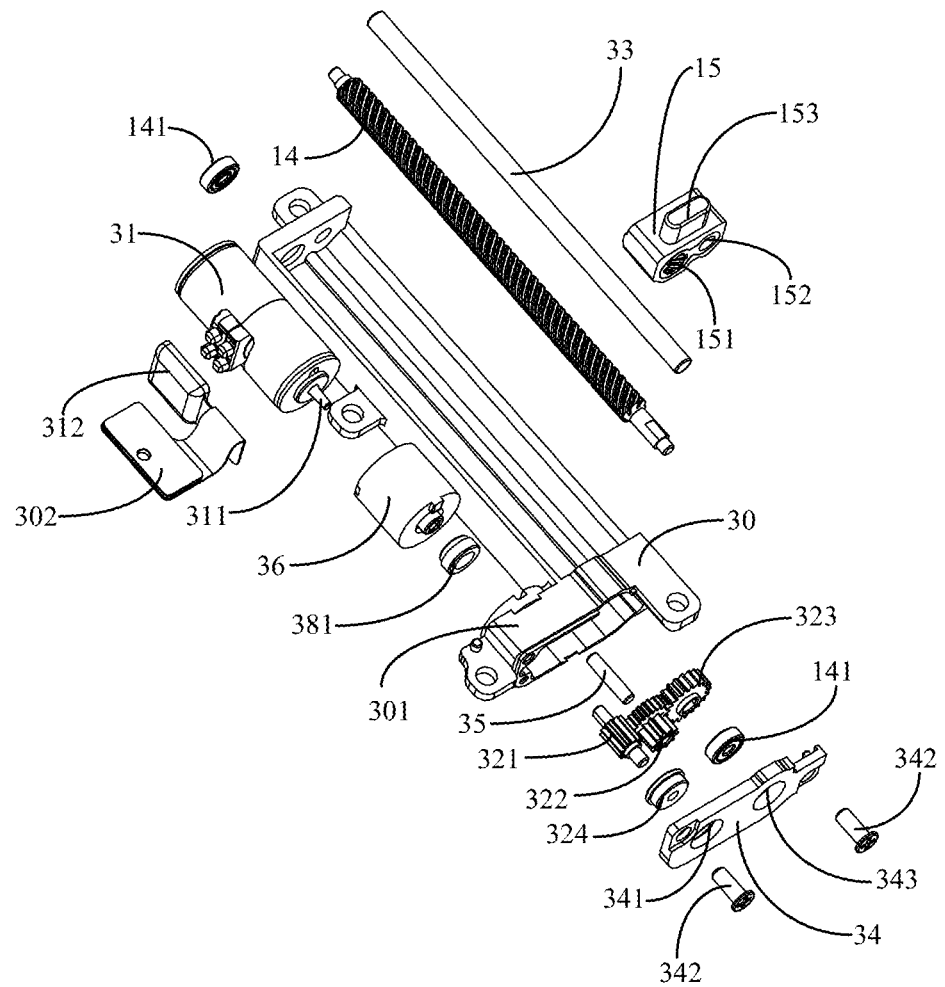
FIG. 18 is an exploded view of a driving mechanism of an electronic device according to an embodiment of the present disclosure.
Figure 19:
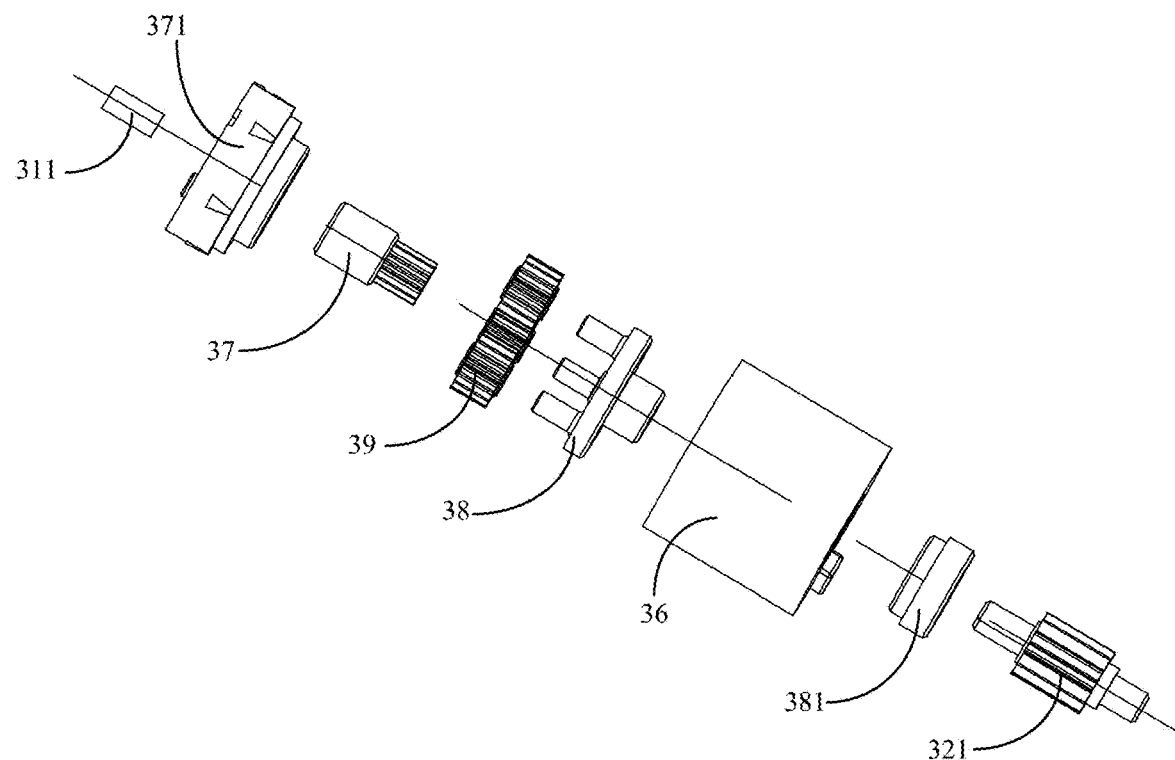
FIG. 19 is an exploded view of a first reduction gearbox of a driving mechanism of an electronic device according to an embodiment of the present disclosure.
Figure 20:
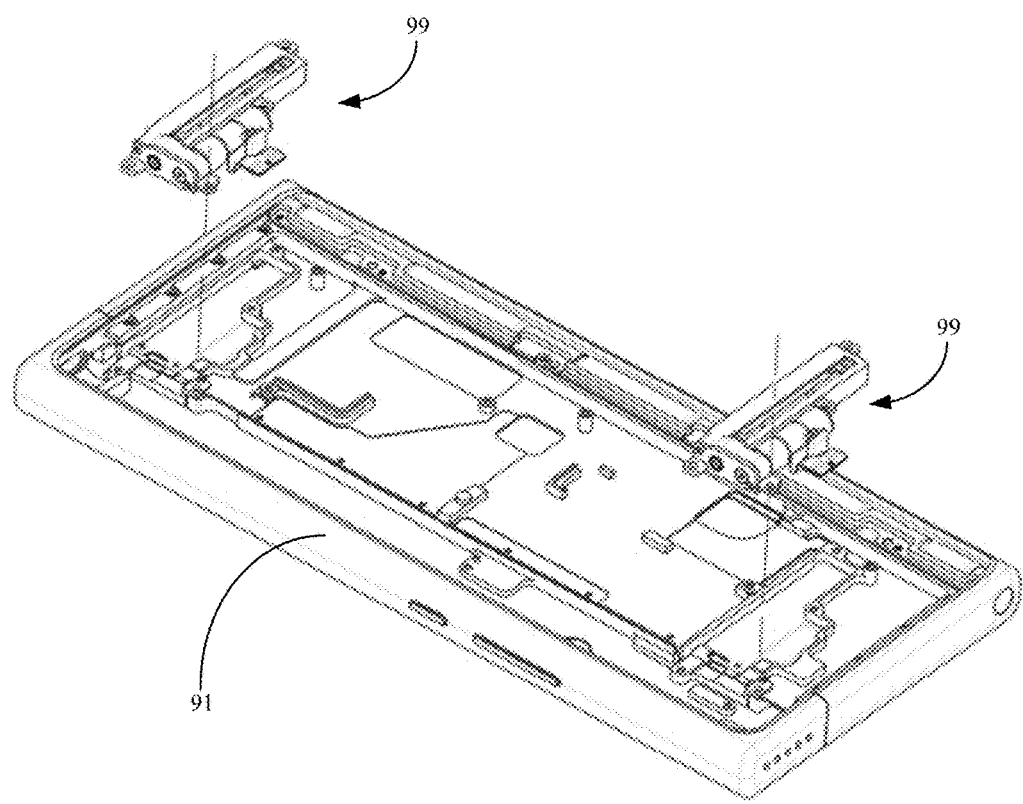
FIG. 20 is a schematic view illustrating a mounting position of a driving mechanism of an electronic device according to an embodiment of the present disclosure.
Figure 21:
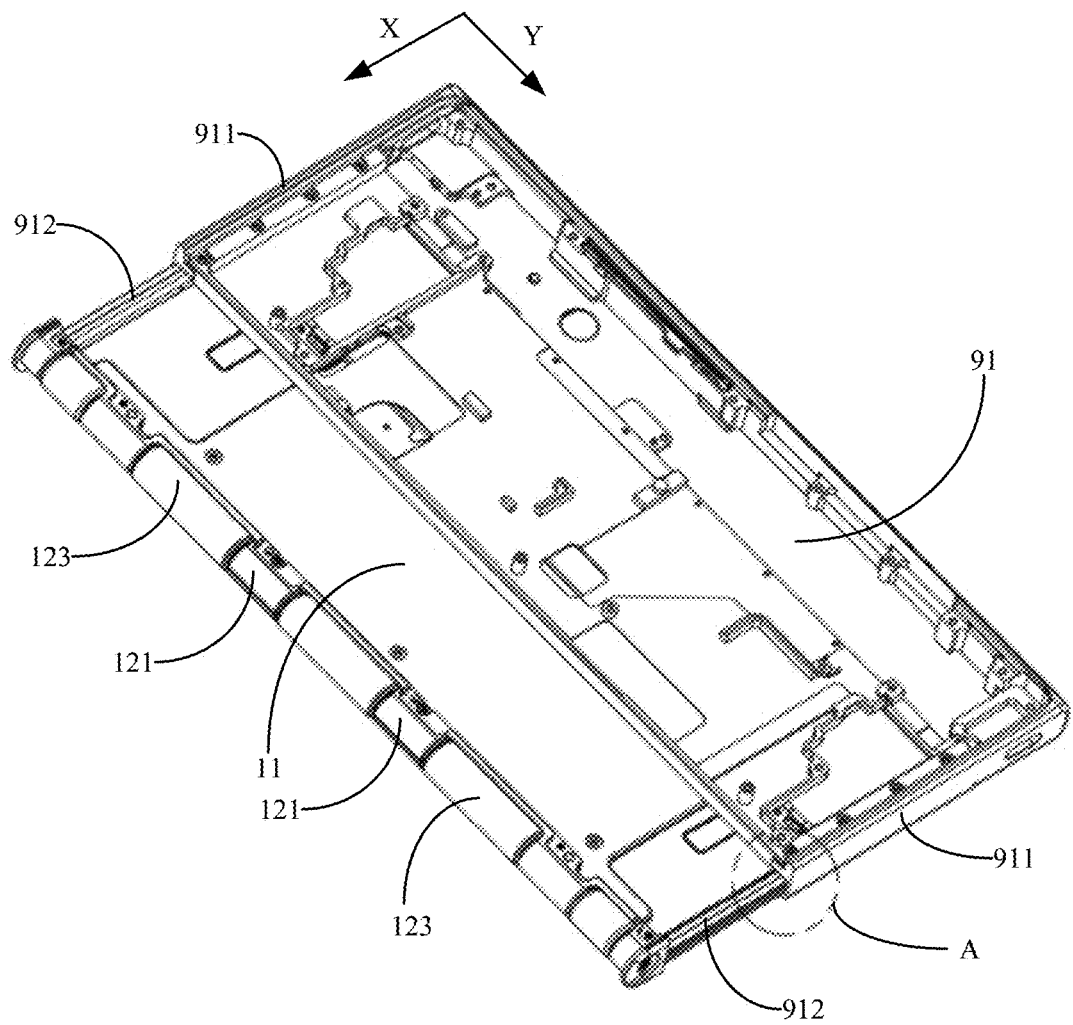
FIG. 21 is a structural view illustrating a sliding rail mechanism and a part of a housing of an electronic device according to an embodiment of the present disclosure.
Figure 22:
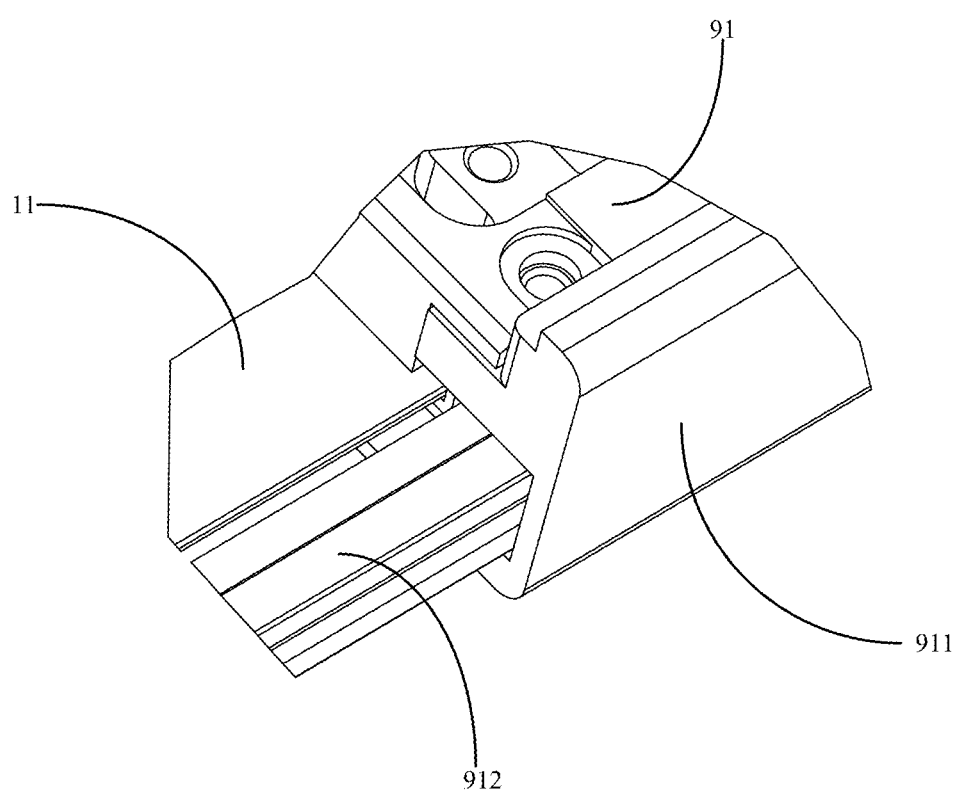
FIG. 22 is an enlarged view of position A in FIG. 21.
Figure 23:
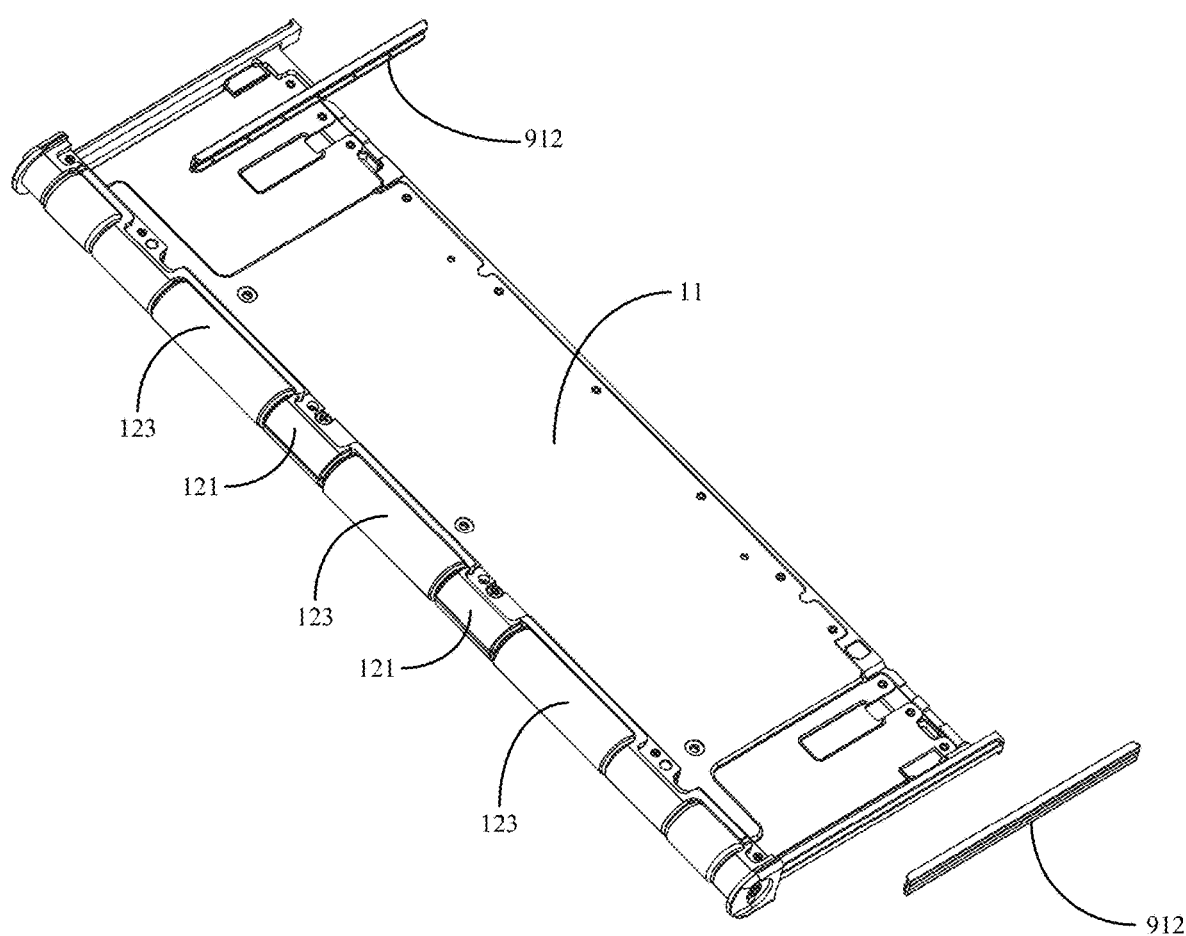
FIG. 23 is a structural view of a bracket of a sliding rail mechanism of an electronic device according to an embodiment of the present disclosure.
Figure 24:
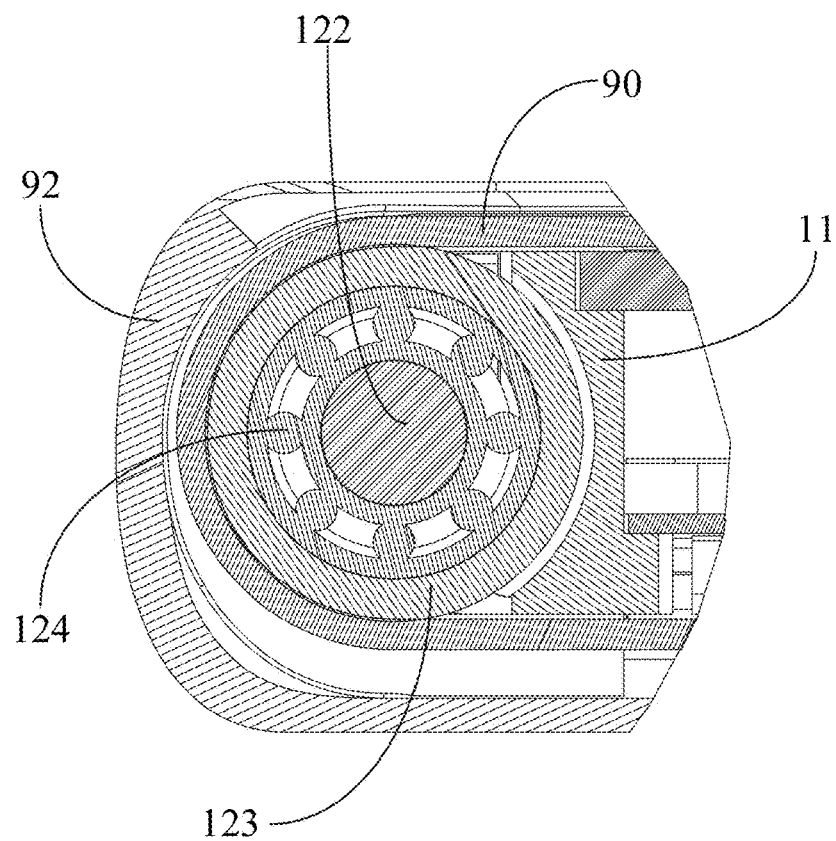
FIG. 24 is a partially enlarged view of a rotating shaft assembly in FIG. 14.
Figure 25:
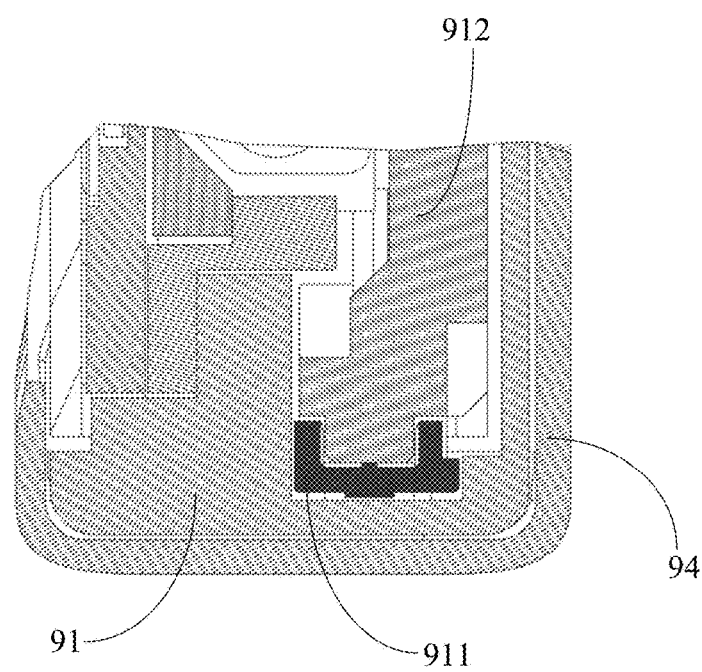
FIG. 25 is a sectional view of FIG. 22.

The driving mechanism is fixed to the middle frame (i.e., the housing) of the whole device as a power source. After receiving an instruction through UI, the electronic device controls the driving mechanism to drive the sliding rail mechanism to move along the first direction X (to the left as illustrated in FIG. 15) such that the whole sliding rail mechanism slides out relative to the first housing 91 in a direction away from the first housing 91. During this process, the first end of the flexible display screen 90 slides with the sliding member 22, and the rotating wheel of the rotating shaft assembly is passively rotated under the force of the flexible display screen 90. Since the second end of the flexible display screen 90 is connected to the first housing 91, as the sliding rail mechanism gradually slides out, an effect of gradually expanding the flexible display screen 90 may be achieved, as illustrated in FIG. 15. During the sliding process of the sliding rail mechanism, the sliding member 22 may be pulled by the flexible display screen to move from one end of the fixed base 21 to the other end, which may further extend the expanding length of the flexible display screen 90. In addition, during the sliding process, the elastic assembly is pulled by the sliding member 22 to generate an elastic pulling force to the sliding member 22 in a direction opposite to the sliding direction. The flexible display screen 90 is constantly subjected to the pulling force in the opposite direction, which is equivalent to pulling the flexible display screen 90 to the right, such that the stretched flexible display screen 90 becomes flatter. In this way, it may ensured that the flexible display screen 90 may move along a curving track according to the design intent, thereby preventing the visual problems such as bulging, swelling and distortion of the screen when the whole device is slid open.

It may be understood that during the whole process, the sliding member 22 is pulled by the second end of the flexible display screen 90 to move from one end of the fixing base 21 to the other end. Assuming that the sliding stroke of the sliding rail mechanism relative to the first housing 91 is denoted as S and the sliding stroke of the sliding member 22 is denoted as S, the first end of the flexible display screen 90 moves a distance of 2S with the sliding rail mechanism relative to the first housing 91.

When the whole device receives an external instruction to retract, the drive motor starts to drive in a reverse direction to retract the sliding rail mechanism and the flexible display screen. During this process, the bracket and the fixed base are driven by the driving mechanism to move in the reverse direction. The flexible display screen and the sliding member are gradually retracted under the elastic force of the elastic assembly, and the sliding member returns to the starting position under the elastic force of the elastic assembly, thereby restoring the flexible display screen to the retracted state. Therefore, the sliding rail mechanism of the present disclosure may smoothly and effectively ensure that the flexible display screen maintains the curved shape in appearance during the sliding and retracting process of the whole device, and ensure that the power loss caused by the friction generated during the sliding and retracting process of the screen is at a relatively low level. The solution is operable and easy to implement and the product reliability may be ensured.

Referring to FIGS. 21 to 25, in some alternative implementations, the housing includes a first housing 91 and a second housing 92 slidably arranged with the first housing 91 along the first direction X, the first housing 91 and the second housing 92 are enclosed to form a receiving structure 991 with an opening. The first housing 91 is provided with a first sliding portion 911 arranged along the first direction X. A first end 901 of the flexible display screen 90 is located at a side close to bottom of the housing, and a second end 902 of the flexible display screen 90 is connected to the first housing 91 to cover the opening. In the present embodiment, the opening is located at top of the housing. In some possible implementations, decorative piece 94 may be arranged at both outer sides of the first housing 91 and the second housing 92 to play a protective and decorative role.

The sliding rail mechanism includes a bracket 11 connected to the first end 901 of the flexible display screen 90, and the bracket 11 is provided with a second sliding portion 912 adapted to the first sliding portion 911. The first sliding portion 911 is one of a slide rail or a slide groove, and the second sliding portion 912 is the other one of the slide rail and the slide groove. The slide rail moves along the slide groove, such that the sliding rail mechanism drives the flexible display screen 90 to slide along the first direction X relative to the first housing 91, thus achieving the expanding and retracting of the flexible display screen. In some possible implementations, the first sliding portion 911 and the first housing of the middle frame housing are integrally formed, which is convenient for production and processing. In the examples illustrated in FIGS. 21 to 23, the first sliding portion 911 is a slide groove, and the second sliding portion 912 is a slide rail. Two sides of the first housing 91 are each provided with the first sliding portion 911 along a second direction (direction Y illustrated in FIG. 21) perpendicular to the first direction X (direction X illustrated in FIG. 21). Two sides of the bracket 11 are each provided with the second sliding portion 912 along the second direction. By arranging two sets of first sliding portion 911 and the second sliding portion 912, the sliding rail mechanism may move more stably relative to the first housing 91, so as to improve the stability of the whole device.

Figure 26:
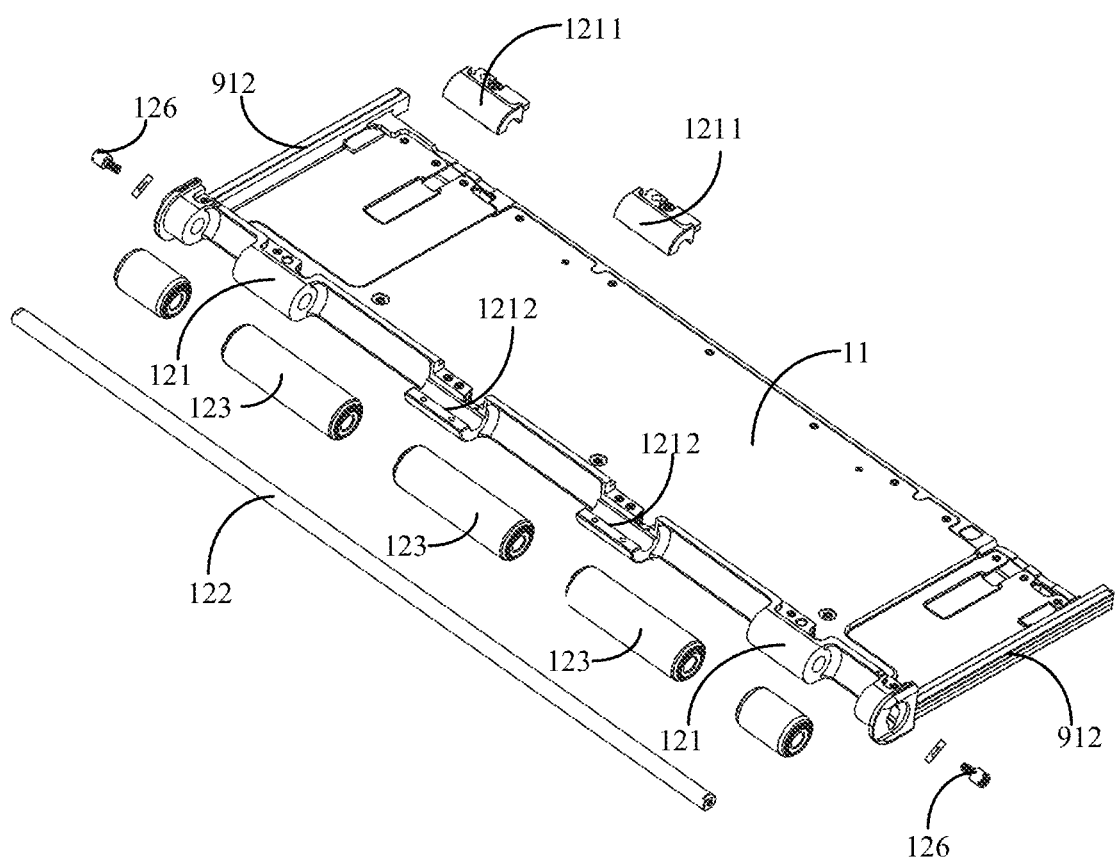
FIG. 26 is a structural view of a sliding rail mechanism of an electronic device according to another embodiment of the present disclosure.
Figure 27:
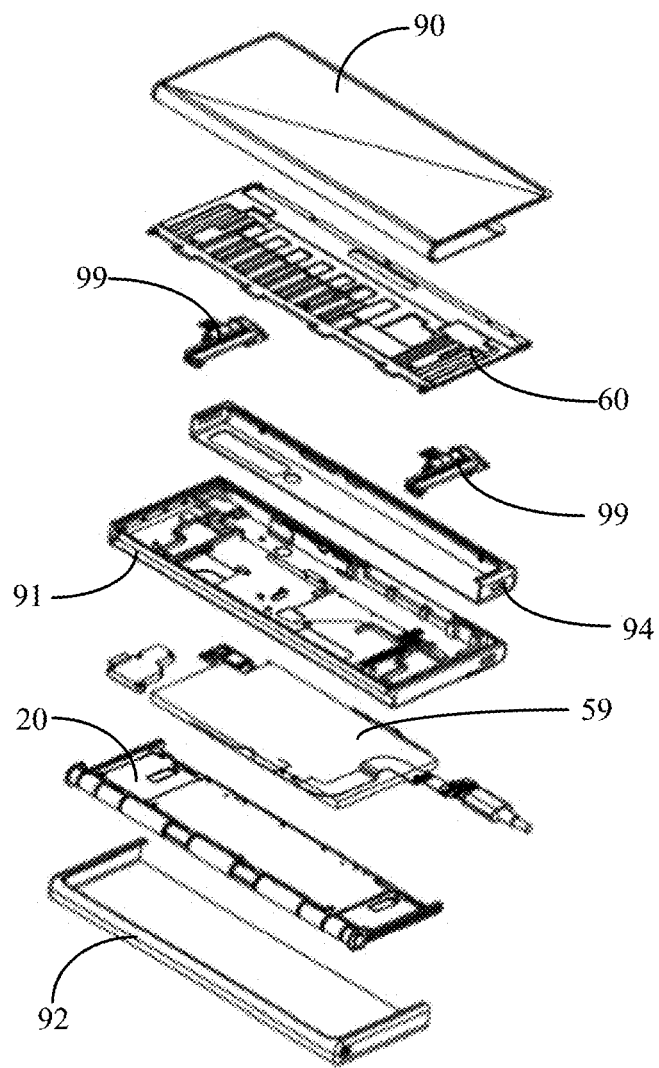
FIG. 27 is a structural view of a sliding rail mechanism of an electronic device according to yet another embodiment of the present disclosure.
Figure 28:
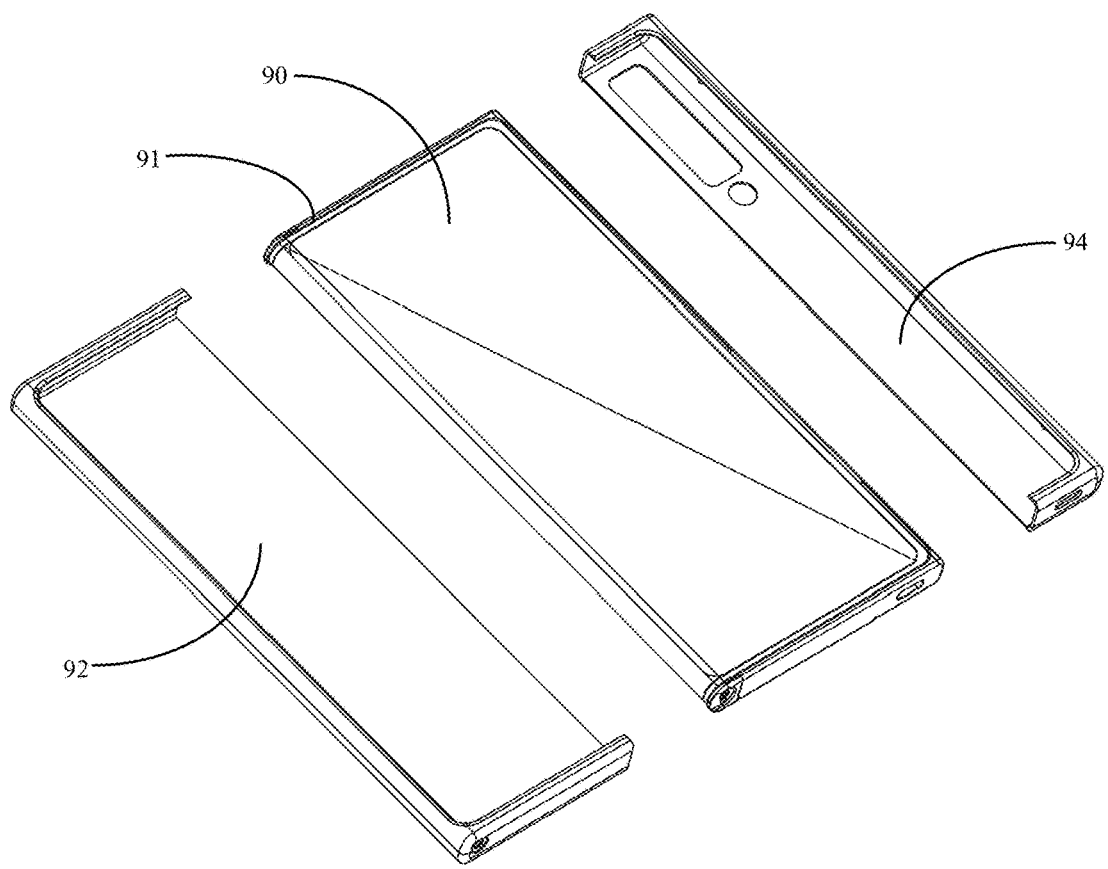
FIG. 28 is a mounting view of a housing and a flexible display screen of an electronic device according to an embodiment of the present disclosure.
Figure 29:
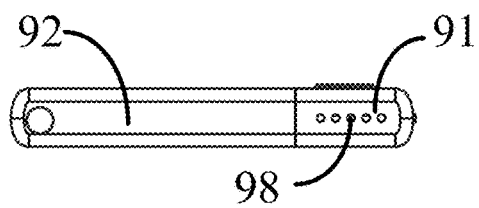
FIG. 29 is a top view of an electronic device in a retracted state according to an embodiment of the present disclosure.
Figure 30:
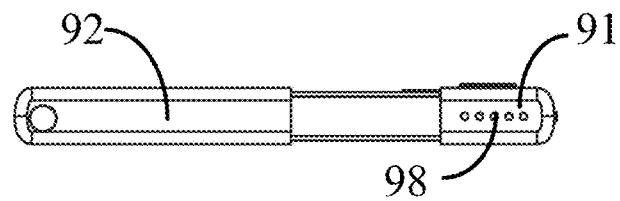
FIG. 30 is a top view of an electronic device in an expanded state according to an embodiment of the present disclosure.
Figure 31:
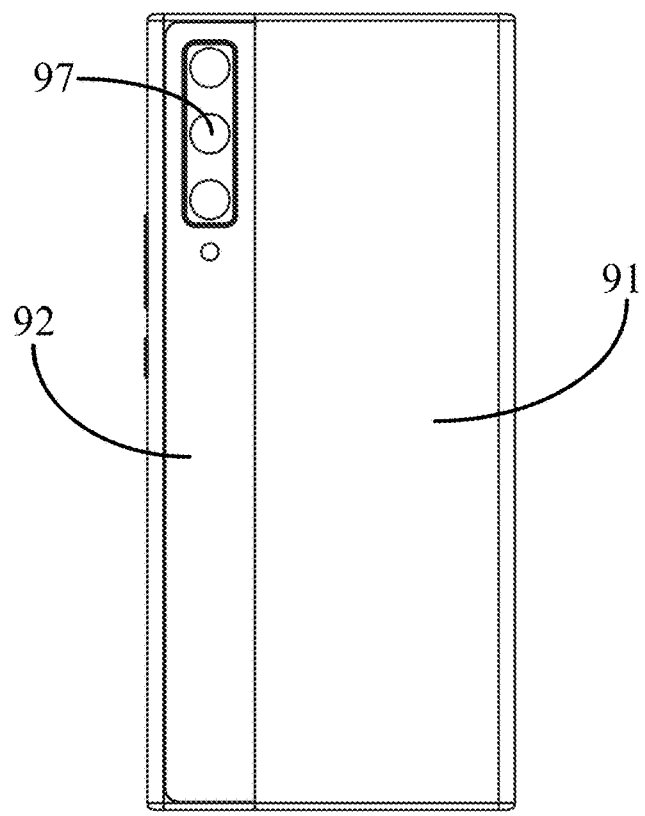
FIG. 31 is a rear view of an electronic device in a retracted state according to an embodiment of the present disclosure.
Figure 32:
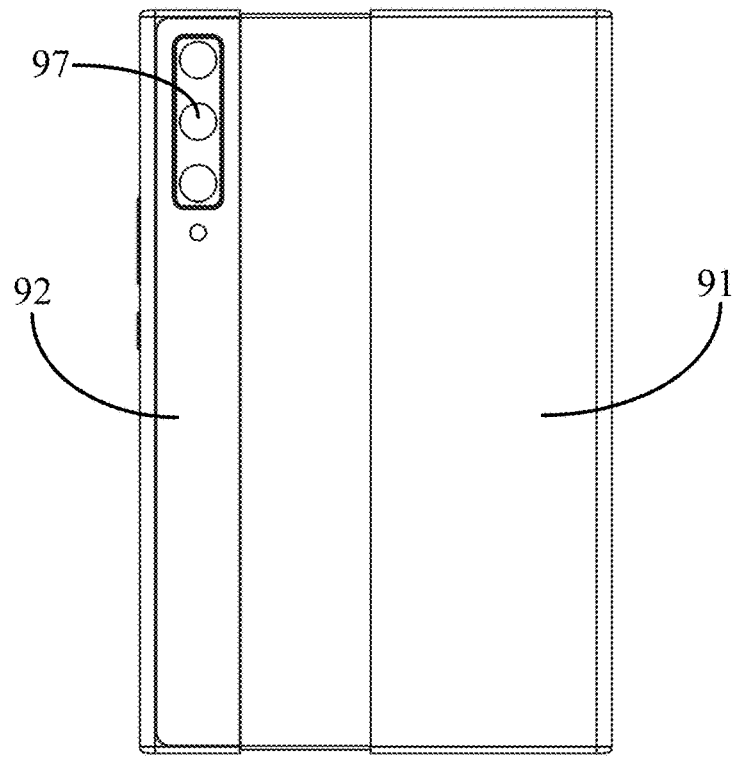
FIG. 32 is a rear view of an electronic device in an expanded state according to an embodiment of the present disclosure.
Figure 33:
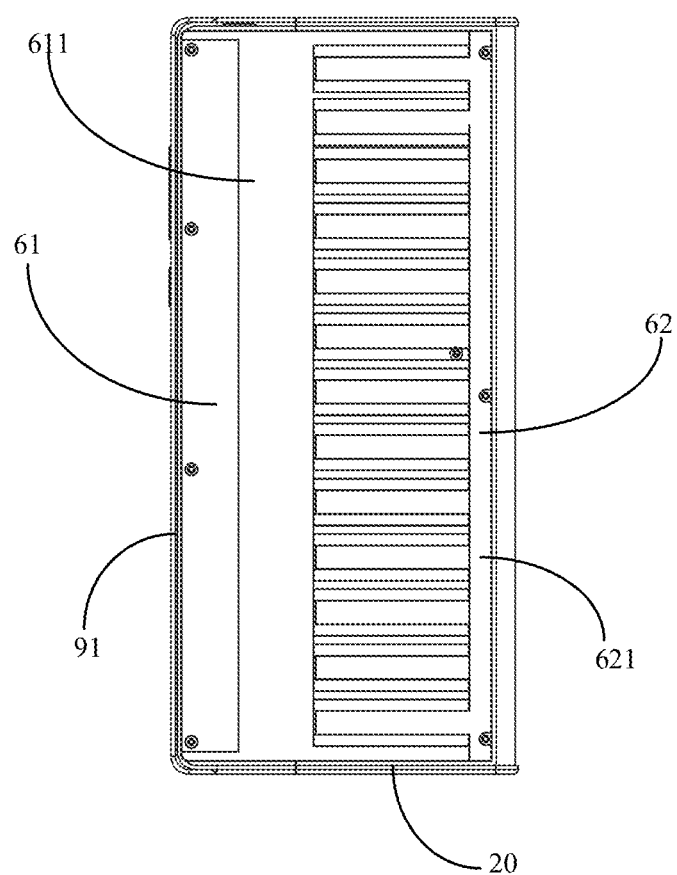
FIG. 33 is a structural view of a support assembly of an electronic device in a retracted state according to an embodiment of the present disclosure.
Figure 34:
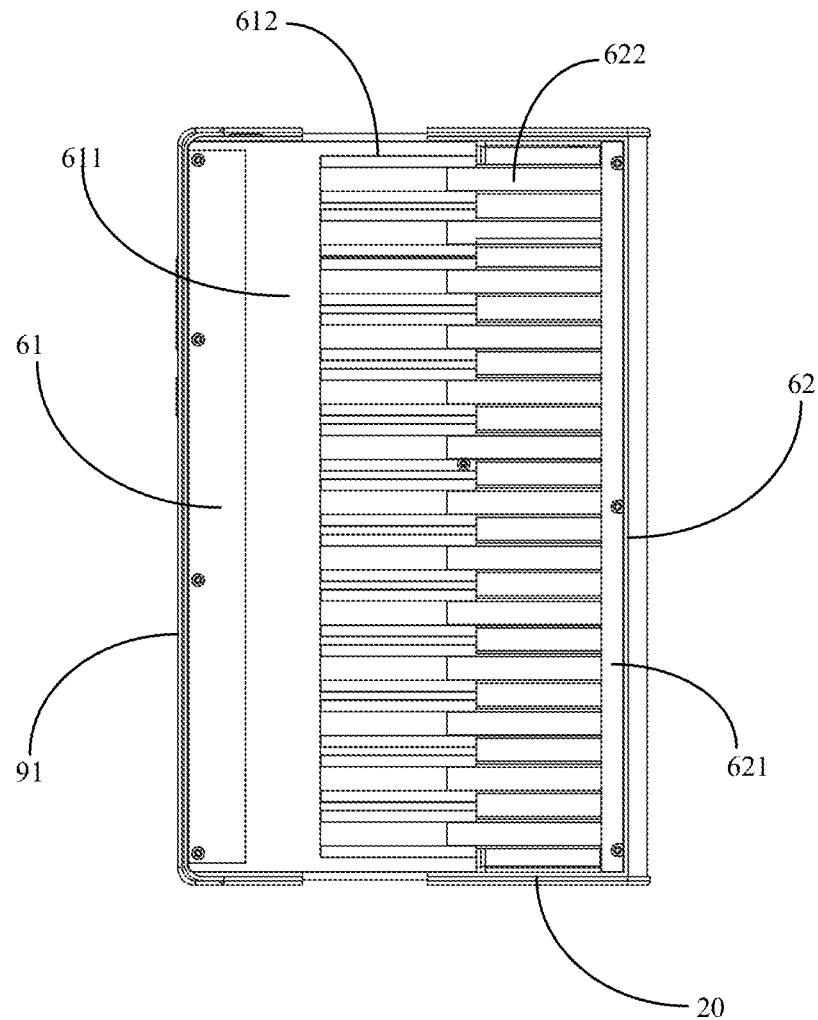
FIGS. 34 and 35 are structural views of a support assembly of an electronic device according to an embodiment of the present disclosure in a retracted state and an expanded state, respectively.
Figure 35:
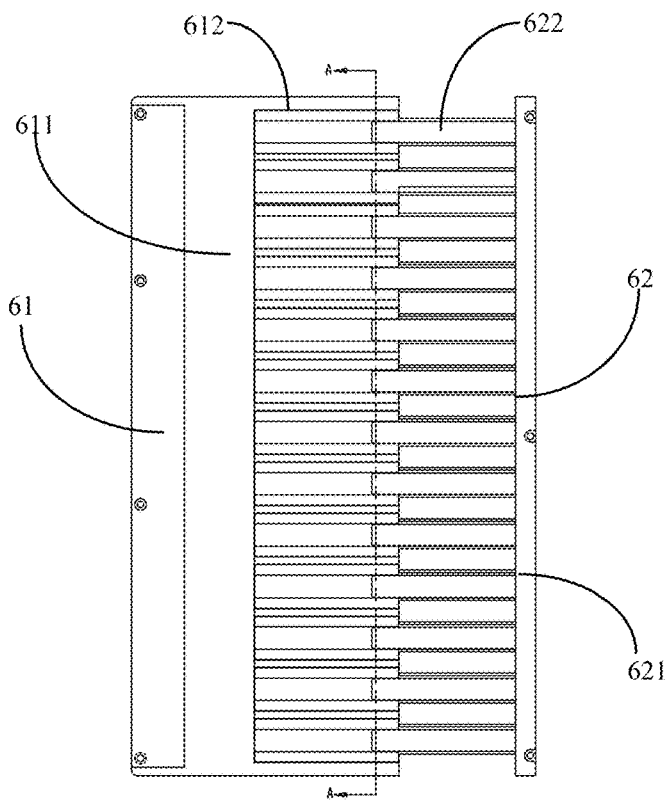

Referring to FIG. 26, in some alternative implementations, the sub-support 121 includes a first hoop base 1211 and a second hoop base 1212 spliced with the first hoop base 1211, the first hoop base 1211 and the second hoop base 1212 hoop on two sides of the rotating shaft 122 and are connected to each other, and any one of the first hoop base 1211 and the second hoop base 1212 is fixedly connected to the bracket 11. In the example illustrated in the figure, the second hoop base 1212 is fixedly connected to the bracket 11. The sub-support 121 adopts a detachable structure in which the first hoop base 1211 and the second hoop base 1212 are spliced with each other, which is convenient for dismounting and mounting.

Referring to FIGS. 27 to 35, the electronic device of the present disclosure may further include a main control board 59 and a support assembly 60. The main control board 59 may be connected to the driving mechanism 99 and the flexible display screen 90 as an overall control terminal of the whole device for controlling the driving mechanism 99 and other components. Stacked functional components such as a battery, the main control board 59, a front camera, a rear camera 97, an earphone 98, a driving electric-machine, the driving circuit board, and the like are mounted on the first housing 91 of the middle frame housing. The first housing 91 may serve as a middle frame housing alone, and decorative piece 94 may be arranged at both outer sides of the first housing 91 and the second housing 92 to play a protective and decorative role.

The support assembly 60 includes a first support plate 61 supported below the flexible display screen 90 and a second support plate 62 slidably connected to the first support plate 61, the first support plate 61 is connected to the first housing 91, and the second support plate 62 is connected to the sliding rail mechanism. In some possible implementations, the second support plate 62 is connected to the sliding rail assembly 20. In some possible implementations, the first support plate 61 may be fixed to the first housing 91 by means of gluing, dispensing or screwing, and the second support plate 62 may be fixed to the sliding rail assembly 20 of the sliding rail mechanism by means of gluing, dispensing or screwing. The first end of the flexible display screen 90 may be fixed to the first support plate by means of gluing or dispensing to achieve a better fixing effect.

The sliding rail mechanism moves along the first direction X relative to the first housing, so as to drive the second housing 92, the first end of the flexible display screen 90, and the second support plate 26 to move relative to the first housing 91, such that the flexible display screen 90 is switched between the expanded state and the retracted state. During the expanding process, the second support plate 62 slides relative to the first support plate 61 to support an expanded part of the flexible display screen 90 relative to the first housing 91.

Based on the above arrangement, the flexible display screen 99 is supported through the support assembly 60, and movement of the sliding rail mechanism drives the flexible display screen 90 to move, so as to expand and retract the flexible display screen 90. During the expanding process, the movement of the sliding rail mechanism drives the second support plate 62 to slide relative to the first support plate 61, so as to support the expanded part of the flexible display screen 90 relative to the first housing 91, and provide full support for the flexible display screen 90, thereby ensuring that the flexible display 90 is not recessed during used in the expanded state.

Figure 36:
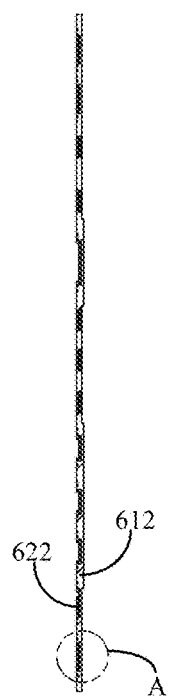
FIG. 36 is a sectional view illustrated in FIG. 35 along plane A-A.

Referring to FIG. 36, in some possible implementations, the first support plate includes a first body portion 611 and a plurality of guide grooves 612 defined in a side of the first body portion 611, the first body portion 611 is connected to the first housing 91, the plurality of guide grooves 612 are spaced apart from each other along a second direction perpendicular to the first direction X, and the guide grooves 612 is arranged to extend along the first direction X. The second support plate 62 includes a second body portion 621 and a plurality of guide rail strips 622 arranged on a side of the second body portion 621, the second body portion 621 is connected to the sliding rail mechanism, the plurality of guide rail strips 622 are spaced apart along the second direction, a number of the guide rail strips 622 is the same as that of the guide grooves 612, and the guide rail strips 622 are slidably arranged in the guide grooves 612 in one-to-one correspondence. It should be noted that in other examples, the positions of the guide grooves and the guide rail strips are interchangeable, and that is, the plurality of guide rail strips are arranged on the side of the first body portion 611, the plurality of guide grooves are defined in the side of the second body portion 621, and the guide rail strips are still slidably arranged in the guide grooves in one-to-one correspondence, which still enables to achieve the function that the second support plate 62 is slidably arranged relative to the first support plate 61.

It may be understood that the first support plate 61 and the second support plate 62 of the support assembly 60 take a sequentially alternating support manner, similar to a comb or comb tooth structure. When the second support plate 62 slides relative to the first support plate 61, a distance between the two support positions is reduced to the minimum, thus achieving a better supporting effect for the flexible display screen 90.

Figure 37:
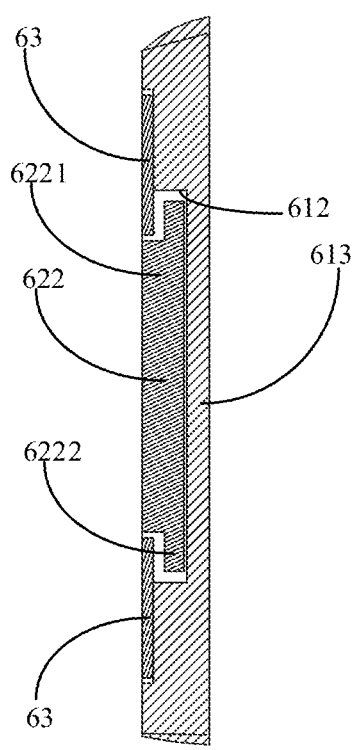
FIG. 37 is an enlarged view of a position A in FIG. 36.

Referring to FIG. 37, in some possible implementations, two sides of an opening of the guide groove 612 are each provided with a limit piece 63, and the limit pieces 63 partially protrude from side walls of the guide groove 612. The guide rail strip 622 includes a first portion 6221 and a second portion 6222 connected to the first portion 6221, and a surface of the first portion 6221 is flush with the two limit pieces 63. The second portion 6222 is slidably arranged in the guide groove 612, and two ends of the second portion 6222 are located between a bottom wall of the guide groove 612 and protruding portions of the limit pieces 63, respectively. In some possible implementations, the limit pieces 63 may be fixed at the opening of the guide groove 612 by electric welding. The limit pieces 63 partially protrude from the side walls of the guide groove 612, and may limit the guide rail strip 622 in the guide groove 612 and prevent the guide rail strip 622 from separating from the guide groove 612, thus improving the overall stability of the support assembly.

In some possible implementations, the guide groove 612 and the two limit pieces 63 are enclosed to form a stepped groove. The guide rail strip 622 has a stepped structure adapted to the stepped groove. With a stepped fitting structure, the guide rail strip 622 may better slide in the guide groove 612 without separating from the guide groove 612.

Figure 38:
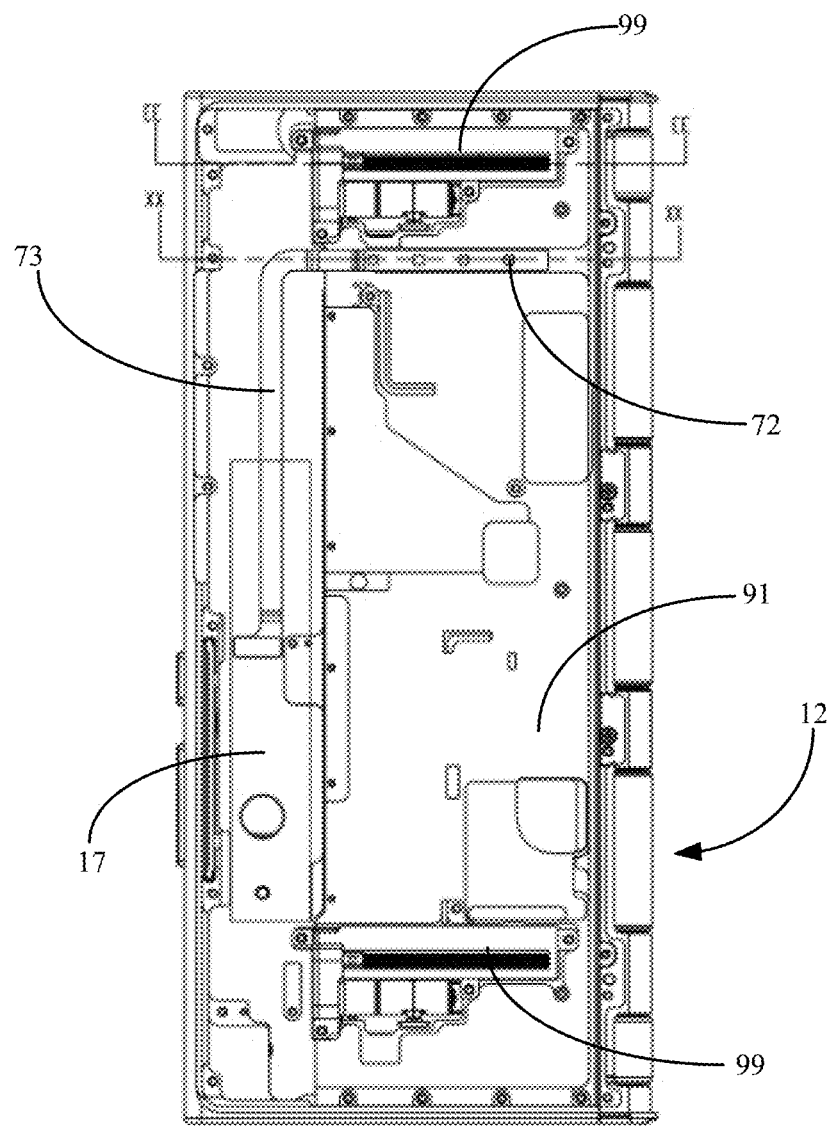
FIG. 38 is a mounting view of a displacement sensor of an electronic device according to an embodiment of the present disclosure.
Figure 39:
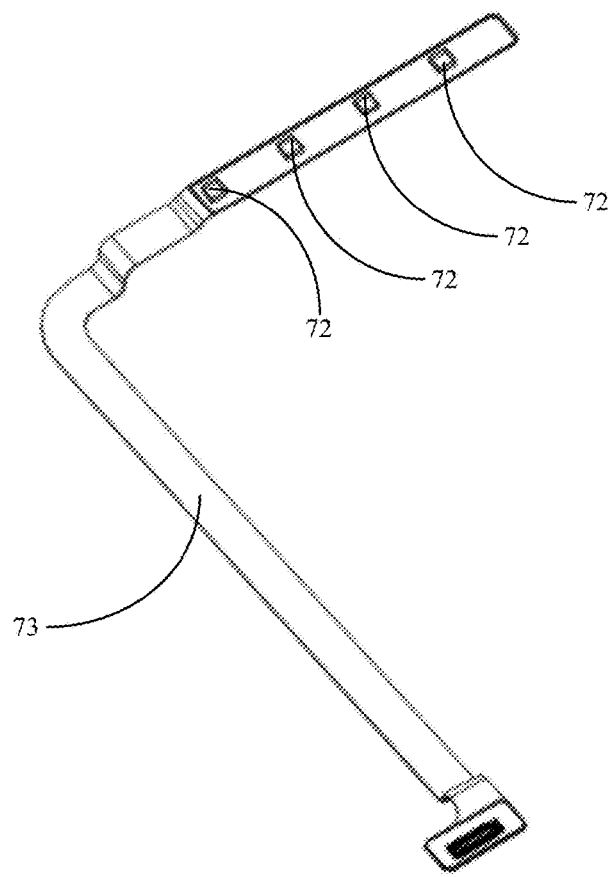
FIG. 39 is a perspective view of a displacement sensor of an electronic device according to an embodiment of the present disclosure.
Figure 40:
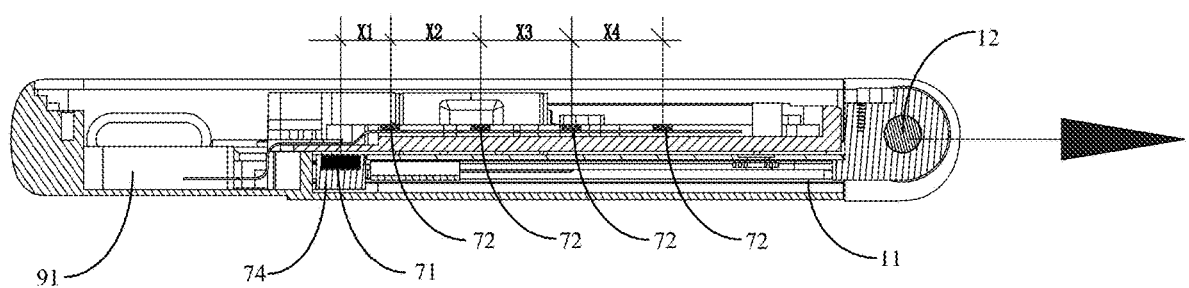
FIG. 40 is a sectional view illustrated in FIG. 38 along plane XX-XX.
Figure 41:
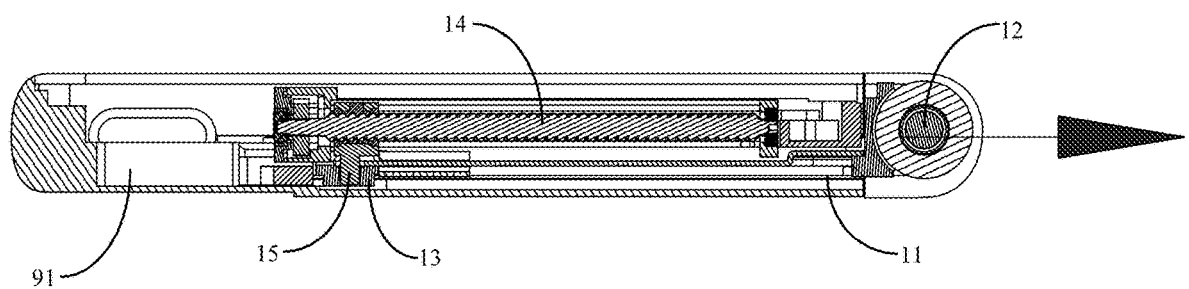
FIG. 41 is a sectional view illustrated in FIG. 38 along plane EE-EE.

Referring to FIG. 38, in some alternative implementations, the electronic device of the present disclosure may further include a control mechanism, the control mechanism includes a displacement sensor and a controller electrically connected to the displacement sensor, and the displacement sensor is configured to measure displacement change of the sliding rail mechanism relative to the first housing 91. The controller is arranged at the first housing 91 and configured to control, according to the displacement change, a first stroke that the sliding rail mechanism moves along the first direction X under the drive of the driving mechanism 99. The driving mechanism 99 drives the sliding rail mechanism to move along the first direction X, so as to drive the bracket 11, the second housing 92 and the first end 901 of the flexible display screen 90 to move along the first direction X relative to the first housing 91, such that the flexible display screen 90 is switched between the expanded state and the retracted state. It may be understood that the displacement sensor is configured to measure the displacement change of the bracket 11 of the sliding rail mechanism relative to the first housing 91, and the driving mechanism 99 drives the bracket 11 of the sliding rail mechanism to move along the first direction X, so as to drive the bracket 11, the second housing 92, and the first end 901 of the flexible display screen 90 to move along the first direction X relative to the first housing 91. In the present embodiment, two driving mechanisms 99 are provided and symmetrically arranged on the first housing 91. The bracket is pushed by nuts of the two sets of driving mechanisms to move outward or retract relative to the first housing, and the dual driving mechanism is adopted to ensure the balance of the pushing force.

Based on the above arrangement, the displacement change of the sliding rail mechanism relative to the first housing 91 is measured by the displacement sensor, the controller may determine, according to the displacement change, the first stroke that the sliding rail mechanism needs to move along the first direction X, and output a control signal to the driving mechanism. Then, the driving mechanism drives the sliding rail mechanism to move along the first direction X according to the control signal, so as to drive the flexible display screen 90 to move, thus achieving the purpose of accurately controlling the movement stroke of the flexible display screen 90.

In some possible implementations, the displacement sensor includes a Hall magnet 71 and a plurality of Hall sensors 72 electrically connected to the controller. The Hall magnet 71 is arranged at one of the sliding rail mechanism and the first housing 91, and the plurality of Hall sensors 72 are arranged at the other one of the sliding rail mechanism and the first housing 91. In the example illustrated in FIG. 38, the Hall magnet 71 is arranged on the sliding rail mechanism, and the plurality of Hall sensors 72 are arranged at the first housing 91. The sliding rail mechanism moves relative to the first housing 91, and the plurality of Hall sensors 72 obtain the displacement change of the sliding rail mechanism relative to the first housing 91 by sensing a magnetic field change of the Hall magnet 71. In some possible implementations, the Hall magnet 71 is arranged on the bracket 11 of the sliding rail mechanism.

It may understood that the Hall sensor 72 may be a Hall chip. Control principle of the controller is as follows: the Hall chips and the Hall magnet cooperate with each other, the Hall magnet is fixed to the bracket 11 of the sliding rail mechanism that is in motion, the Hall magnet generates a magnetic field change, and the Hall chips sense magnetic fields of different intensities to generate an electrical signal change and send the electrical signal change to the controller, the controller determines the displacement change of the bracket of the sliding rail mechanism relative to the first housing according to the electrical signal change (i.e., the stroke that the bracket of the sliding rail mechanism has moved relative to the first housing), and then calculates an additional first stroke that the bracket of the sliding rail mechanism still needs to move relative to the first housing, so as to control the driving mechanism to drive the bracket to move the additional first stroke, thus achieving the purpose of accurately controlling the movement stroke of the flexible display screen.

Referring to FIGS. 38 to 41, in some possible implementations, the Hall magnet 71 is arranged to the sliding rail mechanism, and the plurality of Hall sensors 72 are arranged at the first housing 91 along the first direction X and spaced apart from each other. In the present embodiment, the Hall magnet 71 is arranged at the bracket 11 of the sliding rail mechanism. Four Hall sensors 72 are provided, and distances of the four Hall sensors 72 along the first direction X (i.e. the direction illustrated by the arrow in FIG. 40) is X1, X2, X3 and X4, respectively. Different distances are also maintained between the hall magnet 71 and the four Hall sensors 72, respectively, and need to meet the sensing range of the Hall sensors. By arranging the plurality of Hall sensors to jointly sense the magnetic field changes of the Hall magnet, the displacement change of the bracket relative to the first housing may be calculated more accurately, so as to achieve the purpose of accurately controlling the movement stroke of the flexible display screen.

In some possible implementations, the displacement sensor further includes a sensor circuit board 73 arranged to the first housing 91, and the plurality of Hall sensors 72 are arranged at the sensor circuit board 73 along the first direction X and spaced apart from each other. The driving mechanism includes a driving circuit board 17 electrically connected to the sensor circuit board 73. The controller includes a control circuit board electrically connected to the driving circuit board 17. In some possible implementations, the sensor circuit board 73 may be a FPC board, which reduces the occupied space. The control circuit board is electrically connected to the sensor circuit board 73 and configured to receive data measured by the sensor circuit board 73. The control circuit board is electrically connected to the driving circuit board and configured to send a control signal to the driving circuit board.

It may be understood that the driving circuit board 17 is fixed on the first housing 91 of the middle frame housing, and the Hall chips may be attached to the sensor circuit board 73. The sensor circuit board 73 is connected and fixed to the driving circuit board 17 by a connector, and the sensor circuit board 73 is fixed to the first housing 91, i.e., the bracket of the middle frame. The driving circuit board 17 is connected to the control circuit board through the FPC board. The Hall magnet 71 is fixed to the bracket 11 by gluing. The bracket 11 may be defined with a receiving groove 74 in which the Hall magnet 71 is embedded to ensure the stability of the Hall magnet 71. When the driving mechanism drives the bracket 11 to move, the Hall magnet 71 also moves with it, so as to generate a varying distance from the Hall chip.

The bracket 11 of the sliding rail mechanism is fixedly connected to the second transmission member 15 of the driving mechanism. When the driving mechanism drives the bracket 11 to slide, a varying distance relative to the Hall chips is generated, the Hall magnet arranged on the bracket 11 of the sliding rail mechanism generates a varying distance with the movement of the bracket 11. N/S poles of the Hall magnet form a closed-loop magnetic field. When the sliding rail mechanism is closed, the Hall chips are in this magnetic field and enabled to generate a signal, and the signal may locate the position signal as the sliding rail mechanism is closed in place. When the Hall magnet moves outward with the bracket, the magnetic field of the Hall magnet changes, the Hall chip determines the distance that the bracket is pushed out based on the magnetic field change, generates an electrical signal and transmits the electrical signal to the controller (may be understood as a terminal product CPU), the controller sends a control signal to the driving circuit board according to the signal, and drives the driving electric-machine to rotate or stop. In this way, the stroke of the nut relative to a screw rod is controlled and the sliding stroke of the bracket is controlled accordingly, thus achieving the purpose of accurately controlling the movement stroke of the flexible display screen.

In some possible implementations, the controller is further electrically connected to the flexible display screen 90, and is further configured to determine, according to the first stroke that the sliding rail mechanism moves along the first direction X, a second stroke that the flexible display screen 90 is in the expanded state or the retracted state, and to control display size of the flexible display screen 90 according to the second stroke. It may be understood that by receiving and sensing the signal change of the Hall chips, the controller controls the display size of the flexible display screen 90 according to the first stroke that the sliding rail mechanism moves along the first direction X and the second stroke, so as to control display change of the flexible display screen 90. Thus, the function that the screen displays while sliding may be achieved, and a screen display ratio of any stroke may also be controlled, thus ensuring the display performance of the screen.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:

1. An electronic device, comprising:
   a housing comprising a first housing and a second housing, the first housing and the second housing being enclosed to form a receiving structure with an opening;
   a sliding rail mechanism arranged in the receiving structure and connected to the second housing, the sliding rail mechanism being slidably arranged to the first housing along a first direction;
   a flexible display screen, a first end of the flexible display screen being connected to the sliding rail mechanism, a second end of the flexible display screen being connected to the first housing to cover the opening; and
   a support assembly comprising a first support plate supported below the flexible display screen and a second support plate slidably connected to the first support plate, the first support plate being connected to the first housing, the second support plate being connected to the sliding rail mechanism;
   wherein the sliding rail mechanism moves along the first direction relative to the first housing to drive the second housing, the first end of the flexible display screen, and the second support plate to move relative to the first housing, such that the flexible display screen is switched between an expanded state and a retracted state; during an expanding process, the second support plate slides relative to the first support plate to support an expanded part of the flexible display screen relative to the first housing,
   wherein the sliding rail mechanism further comprises a sliding rail assembly, the sliding rail assembly comprising a fixed base, a sliding member, and an elastic assembly; the fixed base is fixedly connected to the sliding rail mechanism, and the sliding member is slidably arranged to the fixed base along the first direction, a first end of the elastic assembly is connected to the fixed base, and a second end of the elastic assembly is connected to the sliding member; when the sliding member slides along the first direction relative to the fixed base, the sliding member drives the second end of the elastic assembly and the flexible display screen to move together.

2. The electronic device according to claim 1, wherein the first support plate comprises a first body portion and a plurality of guide grooves defined in a side of the first body portion, the first body portion is connected to the first housing, the plurality of guide grooves are spaced apart from each other along a second direction perpendicular to the first direction, and the guide grooves is arranged to extend along the first direction;
   the second support plate comprises a second body portion and a plurality of guide rail strips arranged on a side of the second body portion, the second body portion is connected to the sliding rail mechanism, the plurality of guide rail strips are spaced apart from each other along the second direction, the guide rail strips extend along the first direction, a number of the guide rail strips is the same as a number of the guide grooves, and the guide rail strips are slidably arranged in the guide grooves in one-to-one correspondence.

3. The electronic device according to claim 2, wherein two sides of an opening of the guide groove are each provided with a limit piece, and the limit pieces partially protrude from side walls of the guide groove;
   the guide rail strip comprises a first portion and a second portion connected to the first portion, a surface of the first portion is flush with the two limit pieces, the second portion is slidably arranged in the guide groove, and two ends of the second portion are located between a bottom wall of the guide groove and protruding portions of the limit pieces, respectively.

4. The electronic device according to claim 3, wherein the guide groove and the two limit pieces are enclosed to form a stepped groove; the guide rail strip has a stepped structure adapted to the stepped groove.

5. The electronic device according to claim 1, wherein the first support plate comprises a first body portion and a plurality of guide rail strips arranged on a side of the first body portion, the first body portion is connected to the first housing, the plurality of guide rail strips are spaced apart from each other along a second direction perpendicular to the first direction, and the guide rail strips extend along the first direction;
   the second support plate comprises a second body portion and a plurality of guide grooves defined in a side of the second body portion, the second body portion is connected to the sliding rail mechanism, the plurality of guide grooves are spaced apart from each other along the second direction, a number of the guide grooves is the same as a number of the guide rail strips, and the guide rail strips are slidably arranged in the guide grooves in one-to-one correspondence.

6. The electronic device according to claim 1, further comprising a driving mechanism arranged in the receiving structure and fixedly connected to the first housing, the driving mechanism being connected to the sliding rail mechanism to drive the sliding rail mechanism to move along the first direction;
   the driving mechanism driving the sliding rail mechanism to move along the first direction, so as to drive the second housing and the first end of the flexible display screen to move along the first direction relative to the first housing, such that the flexible display screen is switched between the expanded state and the retracted state.

7. The electronic device according to claim 6, wherein two driving mechanisms are provided and symmetrically arranged on the first housing.

8. The electronic device according to claim 6, wherein the driving mechanism comprises a driving motor, a screw rod connected to the driving motor, and a nut fitted over the screw rod, the screw rod extends along the first direction, and the nut abuts against the sliding rail mechanism;
   the driving motor drives the screw rod to rotate, so as to drive the nut and the sliding rail mechanism to move along the first direction, thereby driving the sliding rail mechanism to move along the first direction.

9. The electronic device according to claim 6, further comprising a main control board connected to the driving mechanism and the flexible display screen as an overall control terminal.

10. The electronic device according to claim 1, further comprising a rotating shaft mechanism, the rotating shaft mechanism comprising a rotating shaft assembly, the rotating shaft assembly comprising a rotating shaft support, a rotating shaft, and a rotating wheel, the rotating shaft support being connected to an side of the sliding rail mechanism, the rotating shaft support being provided with a shaft hole, the rotating shaft passing through the shaft hole, the rotating wheel being fitted over the rotating shaft;

wherein the flexible display screen is wound on the rotating wheel, when the flexible display screen is expanded or the retracted, the flexible display screen drives the rotating wheel to rotate.

11. The electronic device according to claim 1, wherein the sliding rail mechanism comprises a bracket connected to the first end of the flexible display screen, and the bracket is provided with a second sliding portion adapted to the first sliding portion; the first sliding portion is one of a slide rail or a slide groove, and the second sliding portion is the other one of the slide rail and the slide groove.

12. The electronic device according to claim 11, wherein the first sliding portion and the first housing are integrally formed.

13. The electronic device according to claim 1, wherein the second support plate is connected to the sliding rail assembly.

14. The electronic device according to claim 1, further comprising a control mechanism, the control mechanism comprising a displacement sensor and a controller electrically connected to the displacement sensor, the displacement sensor comprises a Hall magnet and a plurality of Hall sensors electrically connected to the controller, wherein the Hall magnet is arranged at one of the sliding rail mechanism and the first housing, and the plurality of Hall sensors are arranged at the other one of the sliding rail mechanism and the first housing.

15. The electronic device according to claim 14, wherein the Hall magnet is arranged on the bracket of the sliding rail mechanism.

16. The electronic device according to claim 14, wherein the Hall magnet is arranged to the sliding rail mechanism, and the plurality of Hall sensors are arranged at the first housing along the first direction and spaced apart from each other.

17. The electronic device according to claim 14, wherein the Hall sensor is a Hall chip.

18. The electronic device according to claim 14, wherein the displacement sensor further comprises a sensor circuit board arranged to the first housing, and the plurality of Hall sensors are arranged at the sensor circuit board along the first direction and spaced apart from each other.

19. The electronic device according to claim 18, wherein the sensor circuit board is a FPC board.

20. An electronic device, comprising:

a housing comprising a first housing and a second housing, the first housing and the second housing being enclosed to form a receiving structure with an opening;

a sliding rail mechanism arranged in the receiving structure and connected to the second housing, the sliding rail mechanism being slidably arranged to the first housing along a first direction;

a flexible display screen, a first end of the flexible display screen being connected to the sliding rail mechanism, a second end of the flexible display screen being connected to the first housing to cover the opening;

a support assembly comprising a first support plate supported below the flexible display screen and a second support plate slidably connected to the first support plate, the first support plate being connected to the first housing, the second support plate being connected to the sliding rail mechanism; and a rotating shaft mechanism, the rotating shaft mechanism comprising a rotating shaft assembly, the rotating shaft assembly comprising a rotating shaft support, a rotating shaft, and a rotating wheel, the rotating shaft support being connected to an side of the sliding rail mechanism, the rotating shaft support being provided with a shaft hole, the rotating shaft passing through the shaft hole, the rotating wheel being fitted over the rotating shaft, wherein the sliding rail mechanism moves along the first direction relative to the first housing to drive the second housing, the first end of the flexible display screen, and the second support plate to move relative to the first housing, such that the flexible display screen is switched between an expanded state and a retracted state; during an expanding process, the second support plate slides relative to the first support plate to support an expanded part of the flexible display screen relative to the first housing, and wherein the flexible display screen is wound on the rotating wheel, when the flexible display screen is expanded or the retracted, the flexible display screen drives the rotating wheel to rotate.

* * * * *